United States Patent [19]
Goto et al.

[11] Patent Number: 6,013,332
[45] Date of Patent: Jan. 11, 2000

[54] BORON DOPING BY DECABORANE

[75] Inventors: Kenichi Goto; Masataka Kase, both of Kawasaki; Jiro Matsuo, Kyoto; Isao Yamada, Kyoto; Daisuke Takeuchi, Kyoto; Noriaki Toyoda, Kyoto; Norihiro Shimada, Kyoto, all of Japan

[73] Assignees: Fujitsu Limited, Kawasaki; Japan Science and Technology Corporation, Saitama, both of Japan

[21] Appl. No.: 08/762,853

[22] Filed: Dec. 6, 1996

[51] Int. Cl.[7] .................................................. C23C 14/14
[52] U.S. Cl. ......................... 427/530; 427/527; 438/515; 438/918
[58] Field of Search .................... 427/530, 523, 427/527; 438/515, 918

[56] References Cited

U.S. PATENT DOCUMENTS

| | | | |
|---|---|---|---|
| 4,693,760 | 9/1987 | Sioshansi | 427/530 |
| 4,851,255 | 7/1989 | Lagendijk et al. | 427/530 |
| 4,892,752 | 1/1990 | Fukuda | 427/530 |
| 5,124,272 | 6/1992 | Saito et al. | 438/300 |
| 5,158,897 | 10/1992 | Sato et al. | 438/515 |
| 5,527,733 | 6/1996 | Nishizawa et al. | 437/160 |
| 5,763,021 | 6/1998 | Young et al. | 427/255.2 |

OTHER PUBLICATIONS

"*Shallow Junction Formation By Polyatomic Cluster Ion Implantation*", by D. Takeuchi, N. Toyoda, N. Shimada, J. Matsuo and I. Yamada; Technical Report of IEIC, SDX 95–19G, pp. 83–89, Dec. 1995.

*Primary Examiner*—Shrive Beck
*Assistant Examiner*—Bret Chen
*Attorney, Agent, or Firm*—Armstrong, Westerman, Hattori, McLeland & Naughton

[57] ABSTRACT

A method of manufacturing a semiconductor device comprising the steps of: ionizing decaborane; and implanting ionized decaborane into a silicon wafer. Solid decaborane can be vaporized in a reduced pressure atmosphere or by heating. A single decaborane molecule can provide 10 boron atoms while the acceleration energy per each boron atom can be reduced to about 1/10 of the acceleration energy for a decaborane molecule.

16 Claims, 25 Drawing Sheets

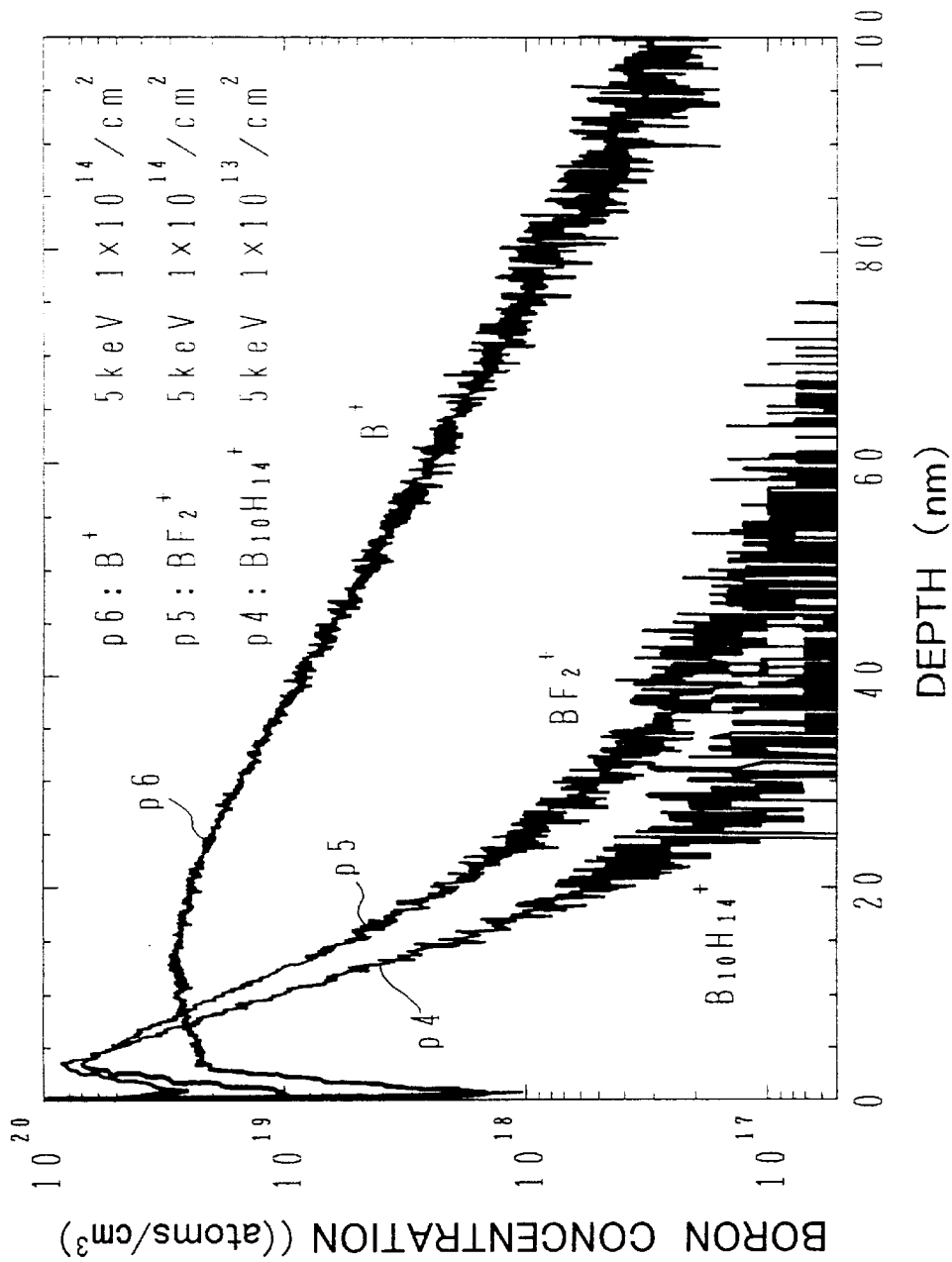

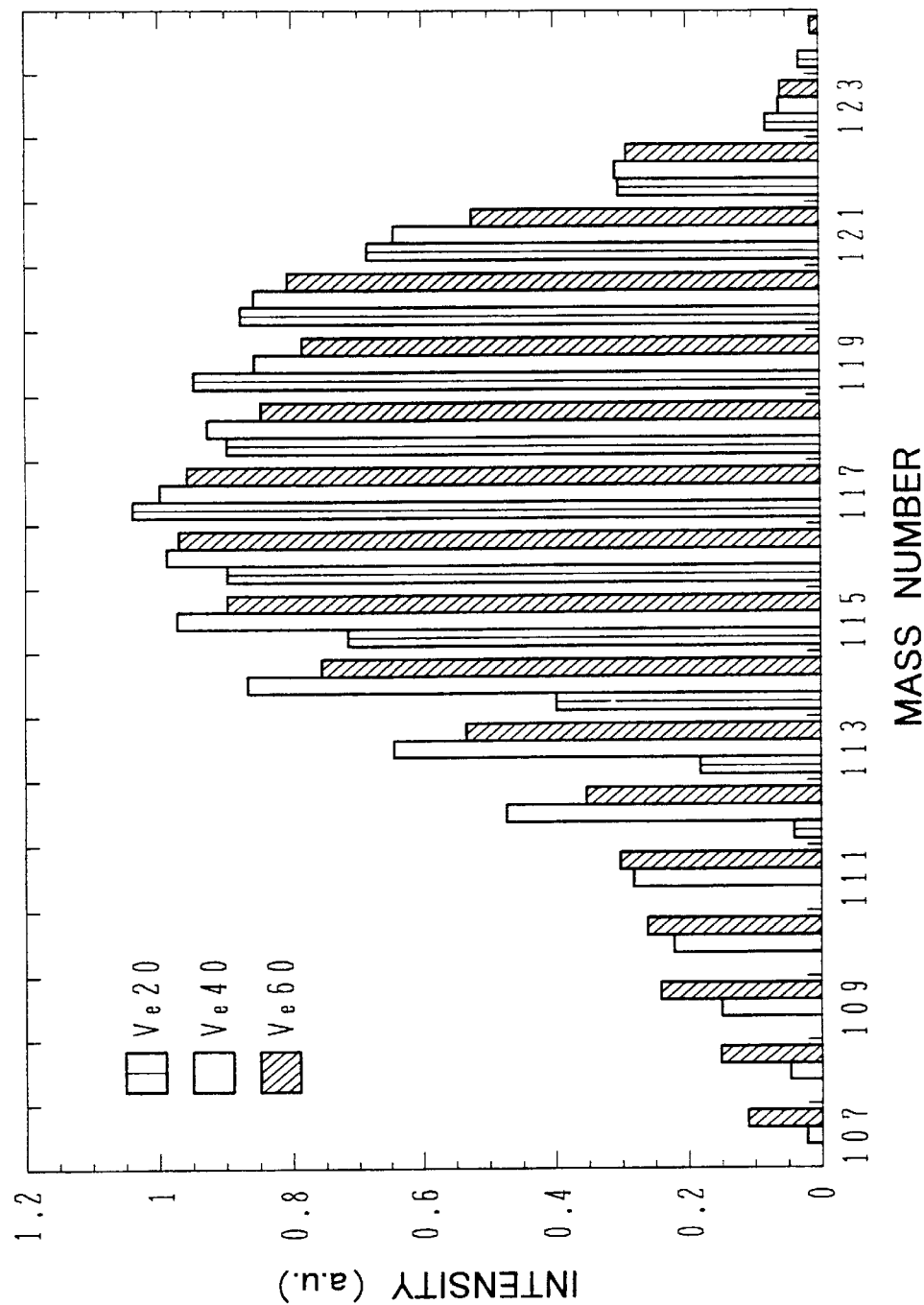

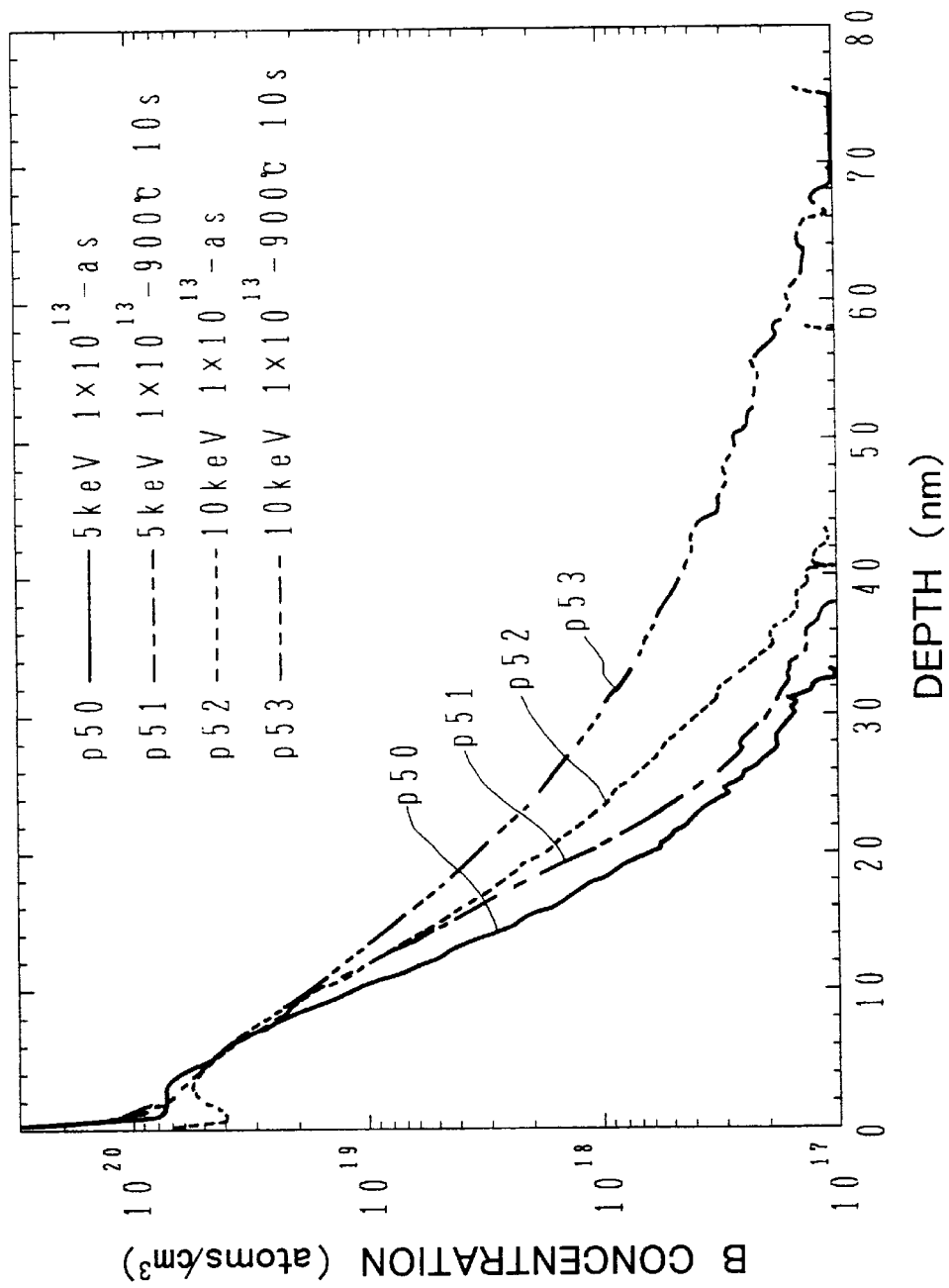

BORON DOPING BY DECABORANE

BACKGROUND OF THE INVENTION

1. Field of the Invention

This invention relates to ion implantation into a semiconductor substrate, and more particularly to boron ion implantation into a semiconductor substrate.

2. Description of the Related Art

Doping impurities of a desired conductivity type into a desired region is an important technology for manufacturing a semiconductor device structure. Ion implantation is widely used as the impurity doping method. In ion implantation, ions of a desired species are given acceleration energy, and implanted into a semiconductor substrate. Then, the implanted impurity atoms are activated by annealing to form electrically active impurity doped region. The depth and the resistivity of the impurity doped region are controlled by selecting the ion acceleration energy and the dose. Usually, boron ions are implanted to form an a p-type region in a silicon substrate.

Miniaturization of MOS transistors in size is required to realize increases in operation speed and integration density of a semiconductor device. When a MOS transistor is scaled down according to the scaling low, the junction depth for source/drain regions of a MOS transistor having a gate length of 0.1 $\mu$m becomes around 0.05 $\mu$m. The junction depth of this order is difficult to be realized by the conventional ion implantation system.

In the general ion implantation system, the beam current becomes smaller as the acceleration energy becomes smaller. The ion beam has a tendency of expanding the beam diameter due to the beam potential which the ion beam has by itself. It is known that the expansion of the beam diameter is proportional to the beam current and inversely proportional to 1.5 powers of the energy. If the acceleration energy is lowered to form a shallow junction, the efficiency of the beam becomes worse and the beam current will become low.

For forming a MOS transistor having gate length of 0.1 $\mu$m or less, the acceleration energy for boron ions should be 5 keV or less. When boron ions are implanted at an acceleration energy of 5 keV, the electric current of the ion beam in a conventional ion implantation system becomes 1 mA or less. If MOS transistors are manufactured using such a low ion beam current, the productivity will significantly be lowered and the manufacturing cost will increase.

For implanting ions shallowly, the mass of ions to be implanted may be increased, as well as lowering the acceleration energy. For implanting boron ions, a method of using $BF_2$ ions is proposed. Compared to the ion implantation of single boron atoms, ion implantation of $BF_2$ ions will decrease the effective acceleration energy for each single boron ion to about $1/5$. Therefore, implantation of $BF_2$ is advantageous to form a shallow junction.

When a MOS transistor is manufactured by using $BF_2$ ion implantation, however, it is known to cause another problem. Ion implantation to the source/drain regions of an MOS transistor will usually implant ions also to the gate electrode. A silicon gate electrode should be doped with a sufficient amount of impurity, for preventing depletion of the gate electrode. In a minute MOS transistor, the gate oxide film should also be formed thin, for example, 10 nm or less. When $BF_2$ ions are used as a source of B atoms, fluorine atoms are also implanted and will accelerate the diffusion of boron atoms through the gate oxide film. When boron atoms pass through the gate oxide film due to the influence of fluorine atoms, and diffuse into the channel region under the gate oxide film, the threshold voltage of the MOS transistor will be varied. Therefore, $BF_2$ ion implantation cannot be easily employed in a p-channel MOS transistor having a thin gate oxide film.

Also, in case of implanting ions into a semiconductor device having minute patterns, charging phenomenon may become problem. When the gate electrode is charged with positive charges and these positive charges discharge through the gate oxide film, the gate oxide film will be deteriorated. The deterioration becomes more significant as the ion current flowing through the gate oxide film becomes larger.

SUMMARY OF THE INVENTION

An object of this invention is to provide a method of manufacturing a semiconductor device capable of easily forming a shallow p-type impurity doped region in a group IV semiconductor substrate.

Another object of this invention is to provide a method of implanting ions, capable of forming a shallow boron implanted region in a silicon semiconductor substrate.

Further object of this invention is to provide a system for manufacturing semiconductor devices adapted to form a shallow p-type impurity doped region in a group IV semiconductor substrate.

According to an aspect of this invention, there is provided a method of implanting ions comprising the steps of: vaporizing solid decaborane ($B_{10}H_{14}$); ionizing the vaporized decaborane molecules; and accelerating decaborane ions by electric field to implant into a target.

According to another aspect of this invention, there is provided an ion implanting system comprising: means for vaporizing solid decaborane ($B_{10}H_{14}$); means for ionizing the vaporized decaborane molecules; and means for accelerating decaborane ions by electric field to implant into a target.

Decaborane has a chemical formula of $B_{10}H_{14}$, and has a significantly larger mass number compared to a single boron atom. When a B ion and a $B_{10}H_{14}$ ion of the same ion valency are accelerated by the same acceleration voltage, each B atom in the $B_{10}H_{14}$ atom will gain an acceleration energy of about $1/10$ compared to a single B atom, because $B_{10}H_{14}$ has a mass of about 10 times as large as that of B. Also, implantation of a single $B_{10}H_{14}$ ion is equivalent to implantation of 10 B atoms. Therefore, the effective dose will also become 10 times as large as the implantation of a single B atom.

Since the acceleration energy for each B atom becomes small, the acceleration energy for $B_{10}H_{14}$ ions can be set high. Thus, the expansion of the beam radius can be suppressed. Also, B atoms 10 times as many as those of the case of implanting B ions can be implanted at the same ion current, and the implantation efficiency becomes also 10 times as large as the case of implanting single B ions. As a total, implantation of $B_{10}H_{14}$ will provide 100 times efficient boron implantation compared to implantation of B ions.

Decaborane does not contain fluorine atoms. Therefore, those affects due to implantation of fluorine atoms do not occur. Even in a MOS transistor having a gate oxide film of a thickness of 10 nm or less, the accelerated diffusion of B atoms can be suppressed. Therefor, it is possible to manufacture p-channel MOS transistors having low variation of the threshold voltage and a high reliability.

Also, since the ion current for implanting $B_{10}H_{14}$ ions can be suppressed to about $1/10$, compared to the ion implantation of B ions, it is possible to effectively suppress the charging phenomenon. Therefore, it becomes possible to manufacture p-channel MOS transistors having gate oxide film of high reliability.

BRIEF DESCRIPTION OF THE DRAWINGS

FIGS. 5, 6, 7A, and 7B are graphs showing boron distribution in the substrate.

FIG. 18 is a graph showing the distribution of various species when decaborane molecules are ionized by electrons of various acceleration voltages.

FIG. 22 is a graph showing boron distribution when decaborane ions are accelerated at 5 keV and 10 keV.

DESCRIPTION OF THE PREFERRED EMBODIMENTS

Hereinbelow, embodiments of the present invention will be described referring to the accompanying drawings.

Figure 1:
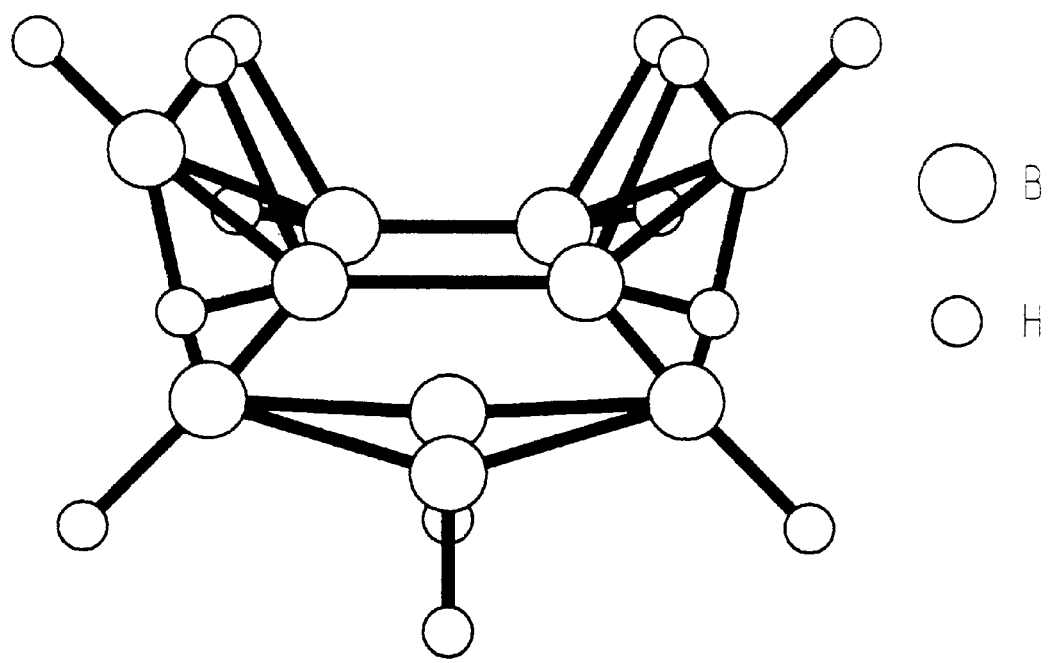
FIG. 1 is a diagram showing the molecular structure of decaborane.

FIG. 1 shows molecular structure of decaborane ($B_{10}H_{14}$). Large circles represent B atoms, and small circles represent H atoms. Decaborane usable for the manufacture of semiconductor devices is available from Aldrich Chemical Corporation, USA.

Figure 2:
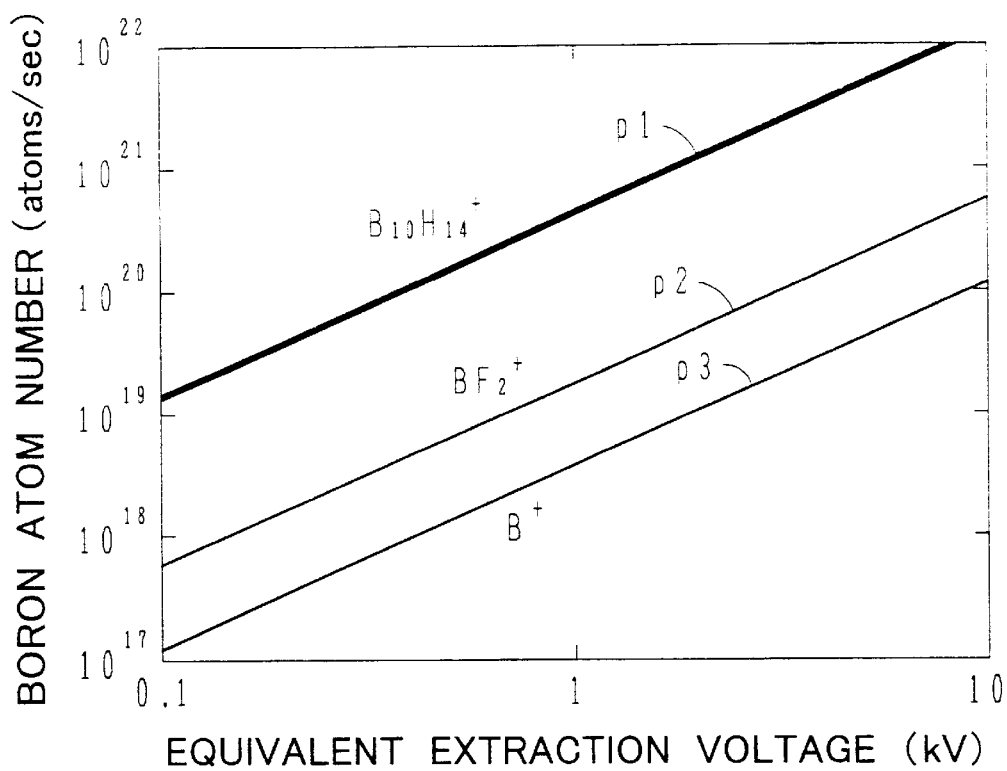
FIG. 2 is a graph showing the relationship between the equivalent extraction voltage and the boron atom number.

FIG. 2 is a graph showing the relationship between the equivalent extraction energy (effective implantation energy) and the implanted boron atom number. The abscissa represents equivalent extraction voltage in kV and the ordinate represents boron atom number in atoms/sec. Curves p1, p2, and p3 show the calculation results according to Langum-Chaild law for $B_{10}H_{14}^+$ ion, $BF_2+$ ion, and $B^+$ ion. It is found that if the implantation depth is set equal, the boron atom number for case of $B_{10}H_{14}$ will become 100 times as large as that of B and 20 times as large as that of $BF_2$.

Figure 3:
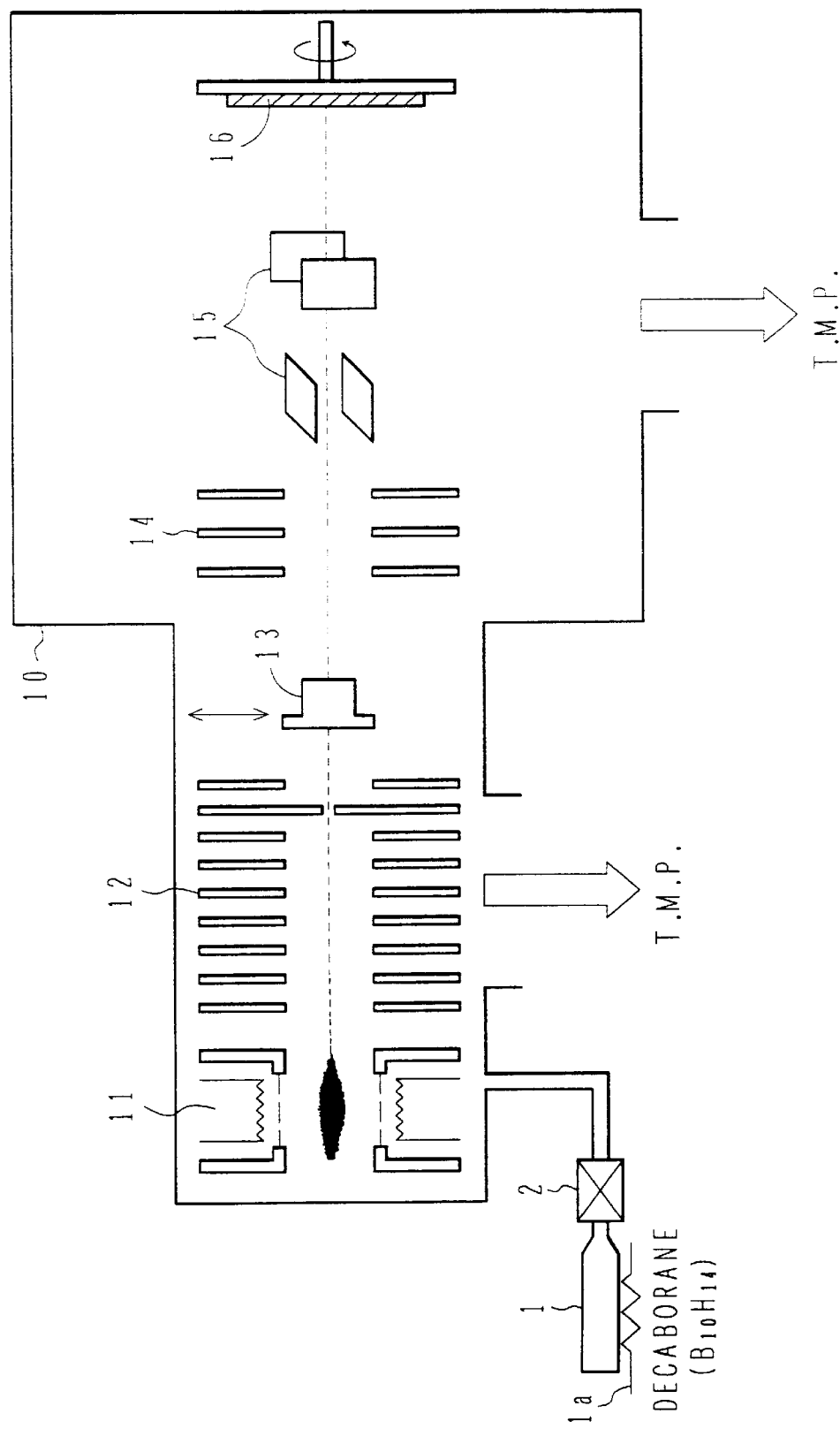
FIG. 3 is a diagram schematically showing a decaborane ion implantation system.

FIG. 3 is a diagram schematically showing a decaborane ion implantation system for Ion implanting decaborane. A decaborane-containing bottle 1 is connected to a vacuum treatment chamber 10 through a valve 2. The vacuum treatment chamber 10 contains an ionizer 11 having an electron gun, a mass filter 12, a Farady cup 13, an accelerator 14, a deflector 15, and a target 16. The bottle 1 may be provided with a heater 1a to accelerate vaporization of decaborane.

Decaborane vaporizes in the decaborane bottle 1 and vaporized decaborane is supplied to the vacuum treatment chamber 10. Vaporized decaborane is subjected to electron bombardment in the ionizer 11 to become positive ions, which are accelerated by the accelerator 14 to be implanted into the target 16.

Figure 4A:
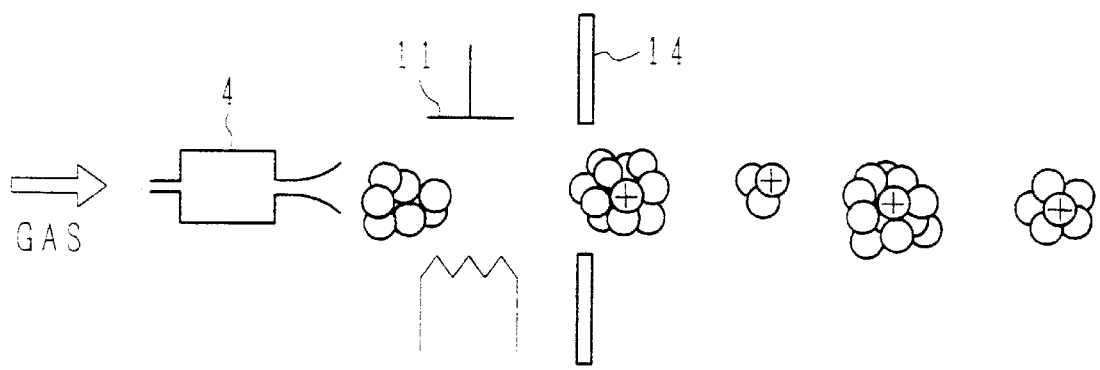
FIGS. 4A, 4B and 4C are diagrams showing how decaborane molecule can be ionized and ionized decaborane ion can be mass-analyzed.
Figure 4B:
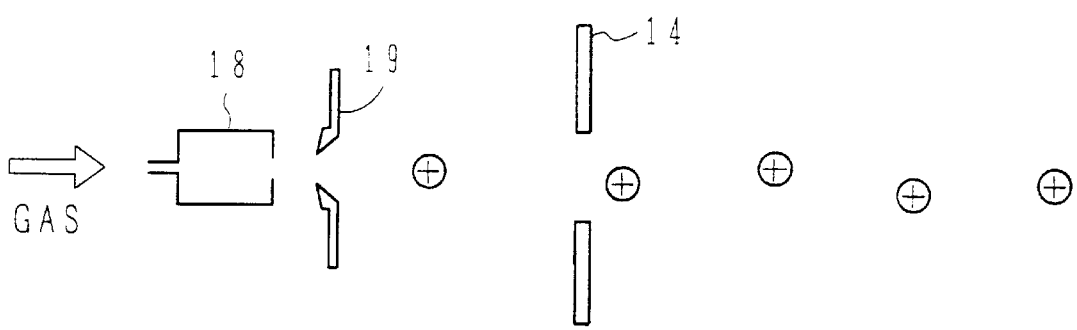

FIGS. 4A and 4B are diagrams showing how decaborane can be ionized. In FIG. 4A, decaborane gas is ejected from a nozzle 4, and ionized by the ionizer 11. The ions are accelerated by the accelerator 14 to proceed toward the target.

In FIG. 4B, decaborane gas becomes plasma in a plasma generator 18. Positive ions are extracted by the extraction field established by the extractor electrode 19, and accelerated by the accelerator 14 to proceed toward the target.

Decaborane contains many constituent atoms, and has a high possibility of decomposition upon irradiation of high energy beam. When decaborane is ionized in plasma, ions of various molecular weights can be generated. By electron irradiation, decomposition of decaborane molecules can be decreased.

Even in the case of ionizing decaborane by plasma, ions of desired molecular weights can be extracted by disposing a mass analyzer after the plasma ionizer.

Figure 4C:
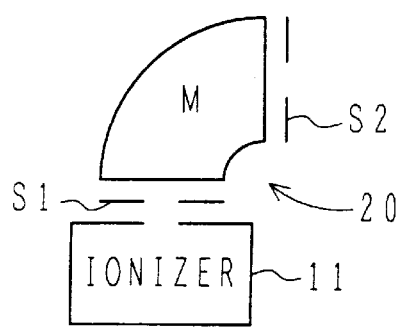

FIG. 4C shows a modified ion generation part of the ion implantation system. An ionizer 11 produces ions of various mass numbers. A mass analyzer 20 having a magnet M and input and output slits S1 and S2 is disposed at the output side of the ionizer 11. The width of the aperture slit of the slits S1 and S2 is variable. The width of the output slit S2 can be varied to pass ions of a desired mass number range.

FIG. 5 is a graph showing boron concentration distribution in a substrate when a silicon substrate is subjected to ion implantation of $B^+$, $BF_2^+$, and $B_{10}H_{14}^+$ ions. The abscissa represents the depth in the substrate in the unit of nm, and ordinate represents the boron concentration in the unit of atoms/cm$^3$. Curves p4, p5, and p6 represent the cases of $B_{10}H_{14}^+$, $BF_2^+$ and $B^+$ ions. Here, $B^+$ ion implantation is done at an acceleration energy of 5 keV and dose of 1×14 cm$^{-2}$, $BF_2^+$ ion implantation is done at an acceleration energy of 5 keV, and dose of 1×10$^{14}$ cm$^{-2}$. The $B_{10}H_{14}^+$ ion implantation is done under the conditions that the acceleration energy is set at 5 keV similar to other cases, and the dose is set at 1×10$^{13}$ cm$^{-2}$ so as to bring the dose of B atoms at the same level as other cases.

In $B^+$ ion implantation, $B^+$ ions are implanted considerably deep into the substrate, and the peak position of the profile lies at a position deeper than 10 nm. In the cases of $BF_2^+$ and $B_{10}H_{14}^+$ ion implantations, the peak position of the profile lies commonly at about 3 nm, and the concentration reduces rapidly at deeper positions. Curves p4 and p5 have different decreasing profile (different inclination), and curve p4 shows narrower distribution of boron, Comparing curves p4 and p5, the peak height of curve p4 is slightly higher than that of curve p5. Thus, by implanting $B_{10}H_{14}^+$ ions, it is possible to obtain a most the same amount of ion implantation of boron at a dose of about $\frac{1}{10}$ of that of $BF_2^+$ ions.

$B_{10}H_{14}^+$ ions and $BF_2^+$ ions are implanted at the same acceleration energy. When the ion implantation is done at the same acceleration energy, $B_{10}H_{14}^+$ ions can be implanted shallower than $BF_2^+$ ions. For implanting borons at the same depth, the acceleration energy for $B_{10}H_{14}^+$ ions can be set higher than that of $BF_2^+$ ions.

Figure 6:
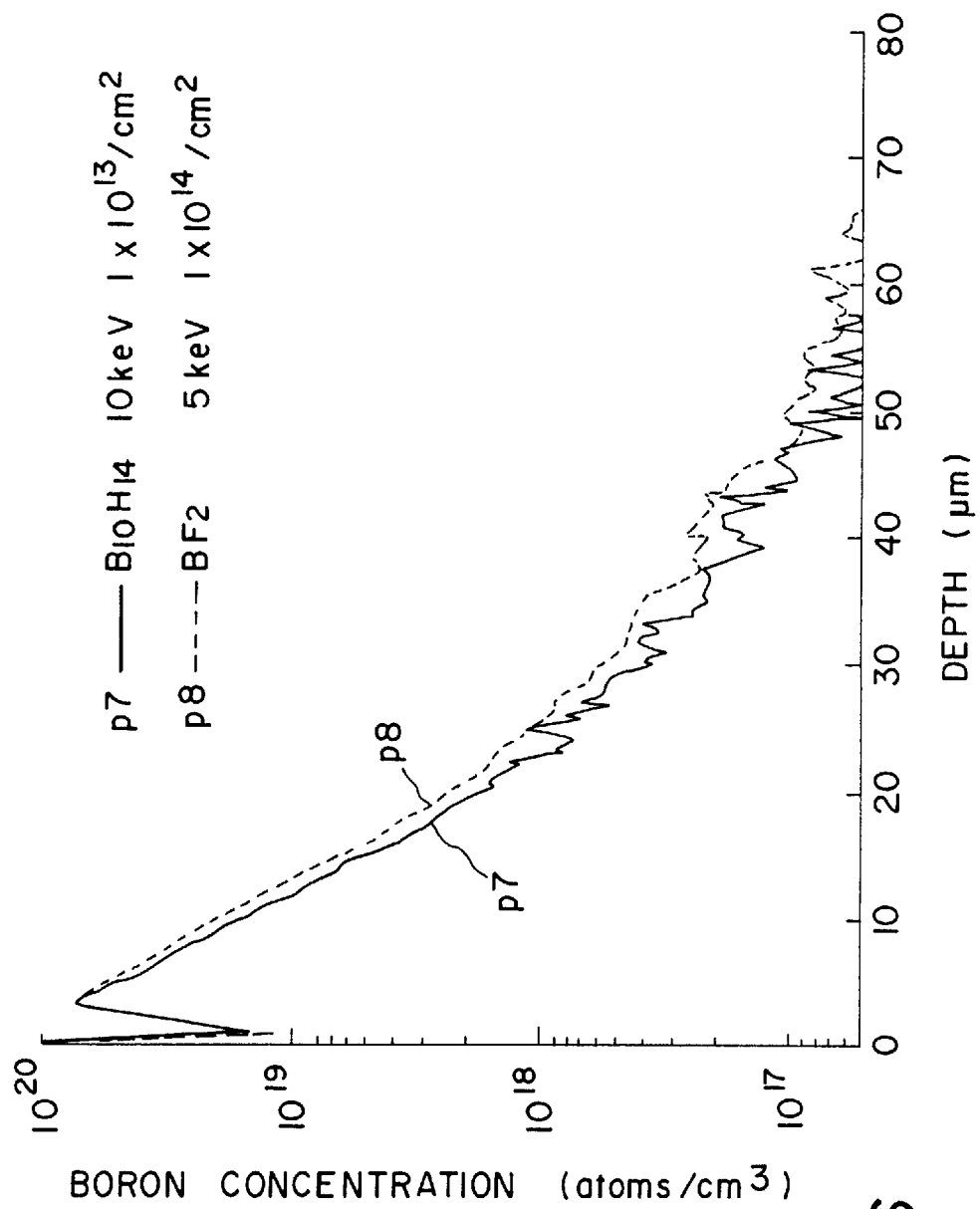

FIG. 6 shows experimental results when $B_{10}H_{14}^+$ ions and $BF_2^+$ ions are implanted at almost the same depth. In the figure, abscissa represents the depth in the substrate in nm, and ordinate represents the boron concentration in atoms/$cm^3$. Curve p7 represents the result when $B_{10}H_{14}$ ions are implanted at an acceleration energy of 10 keV at a dose of $1 \times 10^{13}$ atoms/$cm^2$ and curve 8 shows the result when $BF_2$ ions are implanted at an acceleration energy of 5 keV at a dose of $1 \times 10^{14}$ atoms/$cm^{-2}$. As is apparent from the figure, curves p7 and p8 show almost the same distribution. Therefore, when implanting borons using $B_{10}H_{14}$ as a source, an acceleration energy of almost twice as that for the ion implantation using $BF_2$ as a source can be applied.

Implanted impurities cannot become electrically active impurities unless they are activated by annealing. Activation annealing also causes diffusion of impurity atoms at the same time. Thus, after ion implantation of $B_{10}H_{14}$ ions and $BF_2$ ions, activation annealing at 900° C. and 1000° C. are achieved to observe how the boron distribution will change.

Figure 7A:
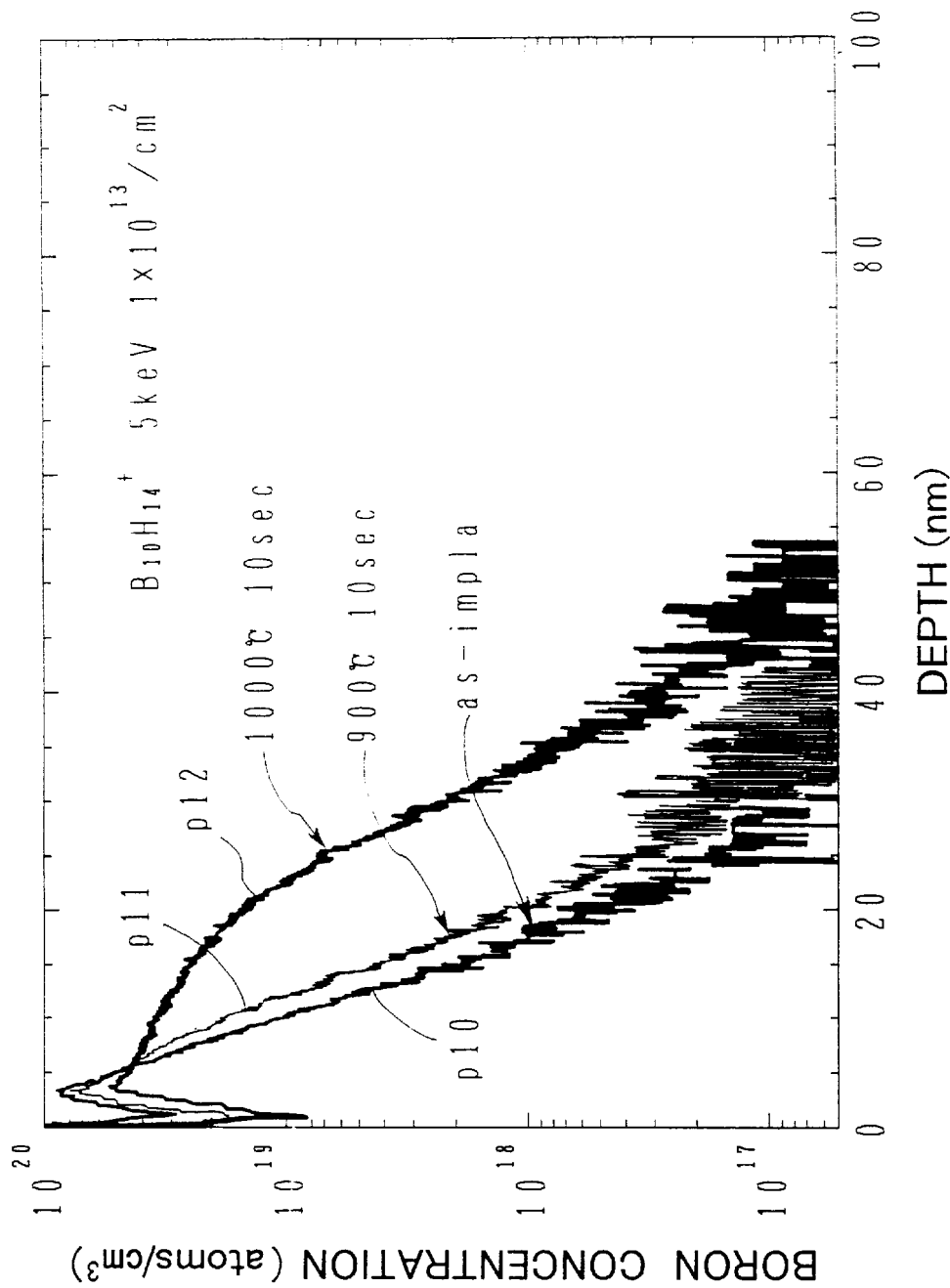
Figure 7B:
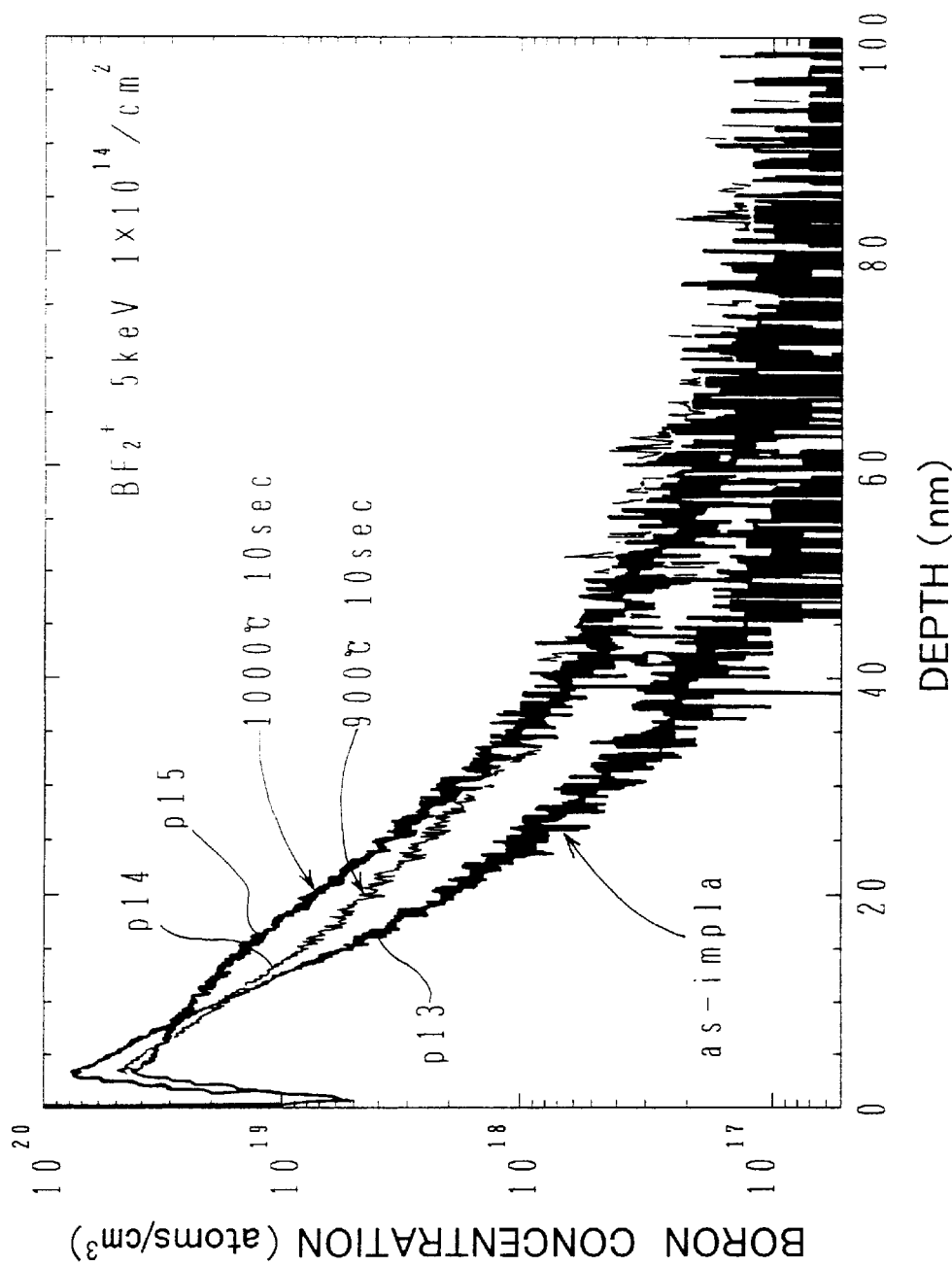

FIGS. 7A and 7B show boron distributions when activation annealing at 900° C. and 1000° C. is performed after ion implantation of $B_{10}H_{14}$ ions and $BF_2$ ions. In each figure, the abscissa represents the depth in the substrate in nm, and the ordinate represents the boron concentration in atoms/$cm^{-3}$. FIG. 7A shows the case when $B_{10}H_{14}^+$ ions are implanted at an acceleration energy of 5 keV at a dose of $1 \times 10^{13}$ $cm^{-2}$, and FIG. 7B shows the case where $BF_2^+$ ions are implanted at an acceleration energy of 5 keV at a dose of $1 \times 10^{14}$ $cm^{-2}$. Curve p10 shows the boron concentration distribution of the as-implanted state, curves p11 and p12 show boron concentration distributions when activation annealing at 900° C. and 1000° C. for 10 seconds is performed. Also, curve p13 shows the boron concentration distribution just after the ion implantation, and curves p14 and 15 show the boron concentration distributions after the activation annealing at 900° C. for 10 seconds and at 1000° C. for 10 seconds. Here, the boron concentration distribution was measured by secondary ion mass spectroscopy (SIMS).

As shown in FIG. 7A, when activation annealing at 900° C. for 10 seconds is achieved after ion implantation of $B_{10}H_{14}$, the boron concentration distribution scarcely changes compared to the boron concentration distribution just after the ion implantation. The average depth of distribution slightly becomes deeper by diffusion. When activation annealing at 1000° C. for 10 seconds is achieved, significant diffusion occurs in a concentration range of $10^{19}$ $cm^{-3}$ or above, whereas in the concentration range of less than $10^{19}$ $cm^{-3}$, the boron concentration distribution just after ion implantation is shifted almost parallelly. In other words, when activation annealing at 1000° C. for 10 seconds is achieved, the implanted region with $B_{10}H_{14}$ ions show nearly ideal box type impurity distribution.

In FIG. 7B, the boron concentration just after ion implantation of $BF_2$ distributes in a considerablely wide depth range, compared to the case of ion implantation of $B_{10}H_{14}^+$ ions. When activation annealing at 900° C. for 10 seconds is achieved, the gradient of boron concentration distribution becomes more gentle and the boron concentration distribution will spread in a clearly wider region. When activation annealing at 1000° C. for 10 seconds is achieved, the boron concentration distribution shows a significant tendency of expanding in a wider range at a boron concentration range of $10^{18}$ $cm^{-3}$ or above, compared to the activation annealing at 900° C. for 10 seconds. In the concentration range of less than $10^{18}$ $cm^{-3}$, there is recognized no significant difference between activation annealing for at 900° C. for 10 seconds and activation annealing at 1000° C. for 10 seconds.

Comparing FIG. 7B with FIG. 7A, it can be found that it is preferable to implant $B_{10}H_{14}^+$ ions and to employ activation annealing at about 900° C. for about 10 seconds or less for obtaining a shallow doped region. Also, when activation annealing at 1000° C. for 10 seconds is achieved after ion implantation of $B_{10}H_{14}^+$ ions, a box type boron concentration can be obtained.

It may be noted that boron concentration in FIGS. 7A and 7B show the result of SIMS measurements, and does not necessarily mean electrically active boron concentration. As will be described later, when activation annealing at the same temperature is performed, a lower sheet resistance can be obtained in the case of implanting $B_{10}H_{14}$ ions, compared to ion implantation of $BF_2$ ions.

Figure 8:
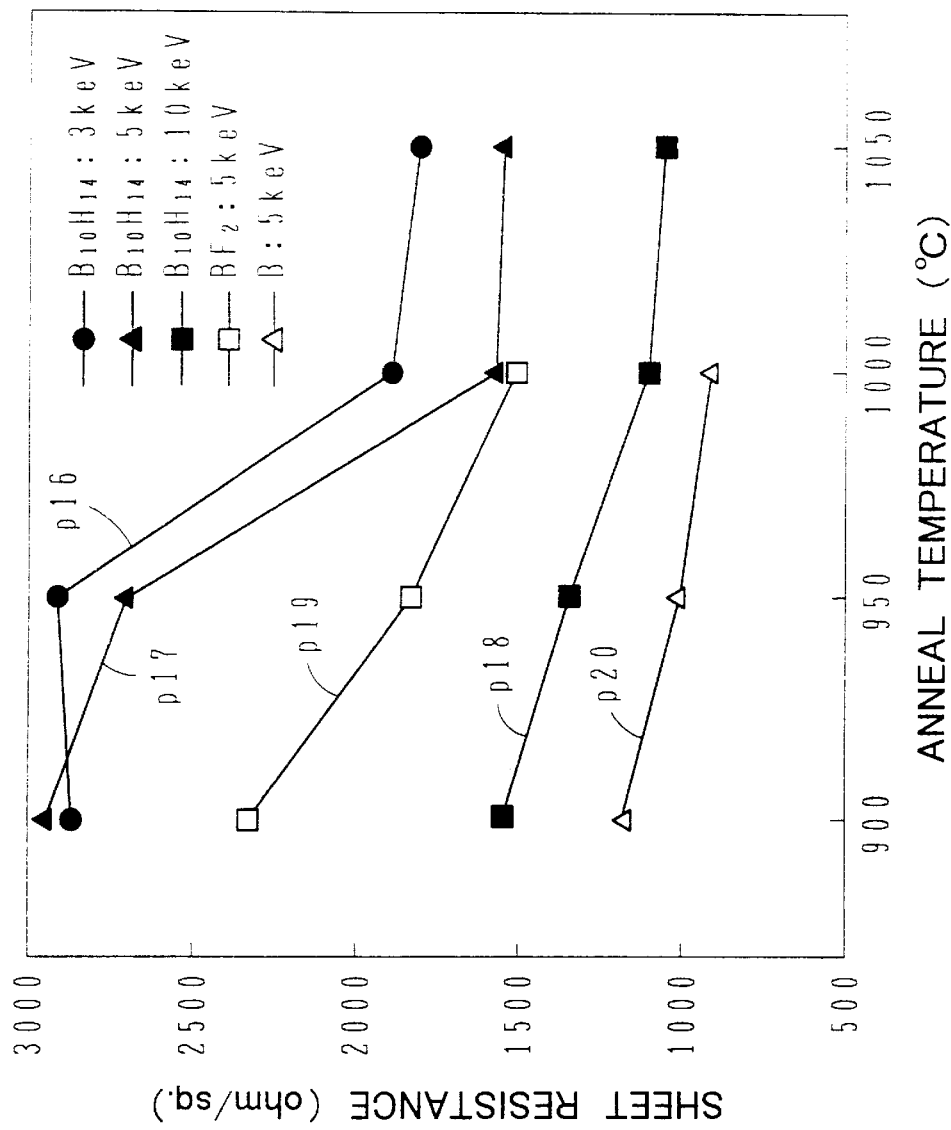
FIG. 8 is a graph showing the relationship between the sheet resistance and the anneal temperature.

FIG. 8 is a graph showing the changes in sheet resistance with respect to activation annealing temperature. The abscissa represents the activation annealing temperature in °C., and the ordinate represents the sheet resistance in ohm/square. The conditions of ion implantation are set as follows. In the case of implanting $B_{10}H_{14}^+$ ions, the acceleration energy is set at 3 keV, 5 keV, and 10 keV. In the case of implanting $BF_2^+$ ions, the acceleration energy is set at 5 keV. The activation annealing temperature is set at 900° C., 950° C., 1000° C. and 1050° C. Curve p16 represents the case of ion implanting $B_{10}H_{14}$ at an acceleration energy of 3 keV, curve p17 represents the case of ion implanting $B_{10}H_{14}^+$ ions at an acceleration energy of 5 keV, and curve p18 shows the result of implanting $B_{10}H_{14}^+$ ions at an acceleration energy of 10 keV. Curve p19 shows the result of implanting $BF_2^+$ ions at an acceleration energy of 5 keV, as a reference. Also, curve p20 shows the result of implanting $BF_2^+$ ions at an acceleration energy of 5 keV.

As shown in FIG. 6, the ion implantation of $B_{10}H_{14}$ at an acceleration energy of 10 keV and ion implantation of $BF_2$ at an acceleration energy of 5 keV show almost the same results. In FIG. 8, curves p18 and p19 correspond to these states. Curve p18 lies always lower than curve p19, showing that a lower sheet resistance was obtained. That is to say, when ion implantations of the same depth and same dose are performed, a lower sheet resistance can be obtained by implanting $B_{10}H_{14}$ ions, compared to ion implantation of $BF_2$ ions.

Also, the results of FIG. 8 show that the sheet resistance can be lowered by implanting $B_{10}H_{14}$ ions and performing an appropriate activation annealing.

Figure 9:
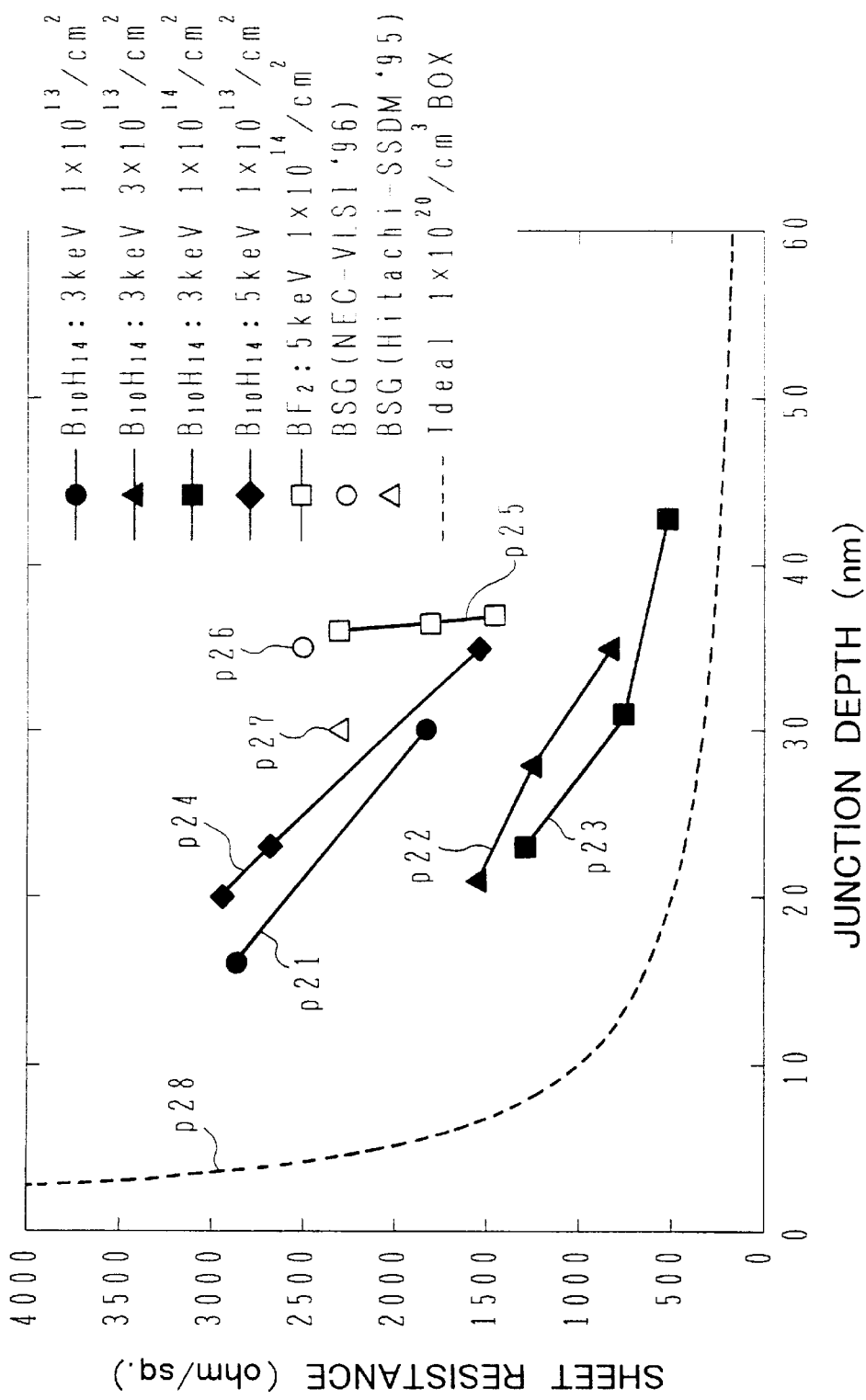
FIG. 9 is a graph showing the relationship between the sheet resistance and the junction depth.

FIG. 9 is a graph showing the relationship of the sheet resistance with respect to the junction depth. The abscissa represents the junction depth in nm, and the ordinate represents the sheet resistance in ohm/square. The conditions of ion implanting decaborane are set as follows. At acceleration energy of 3 keV, the implantation dose is varied at $1 \times 10^{13}$ $cm^{-2}$ (curve p21), $3 \times 10^{13}$ $cm^{-2}$ (curve p22), and $1 \times 10^{14}$ $cm^{-2}$ (curve p23). At an acceleration energy of 5 keV, the dose was set at $1\times10^{13}$ cm$^{-2}$ (curve p24). Further, BF$_2$ ions are ion implanted at an acceleration energy of 5 keV at a dose of $1\times10^{14}$ cm$^{-2}$ (curve p25). Solid phase diffusion from a boro-silicate glass (plots p26 and p27) and an ideal sheet resistance of box shaped distribution of a carrier concentration $1\times10^{20}$ cm$^{-3}$ (curve p28) are also shown as references.

Activation annealing after ion implantation is done in a temperature range of 900° C.–1000° C. For example, comparing curve p24 representing the case of ion implanting decaborane at an acceleration energy of 5 keV, and curve p25 representing the case of ion implanting BF$_2$ ions at the same boron dose, it can be seen that a shallower junction with a lower resistance can be formed by ion implanting decaborane. Also, as shown by curves p22 and p23, an extremely low sheet resistance can be obtained. This may ascribed to the fact that boron atoms 10 times as many as the number of ions can be doped at the same ion current. Compared to plots p26 and p27 showing boron diffusion region formed by solid diffusion, a considerably shallower junction can be formed by decaborane implantation.

Figure 10:
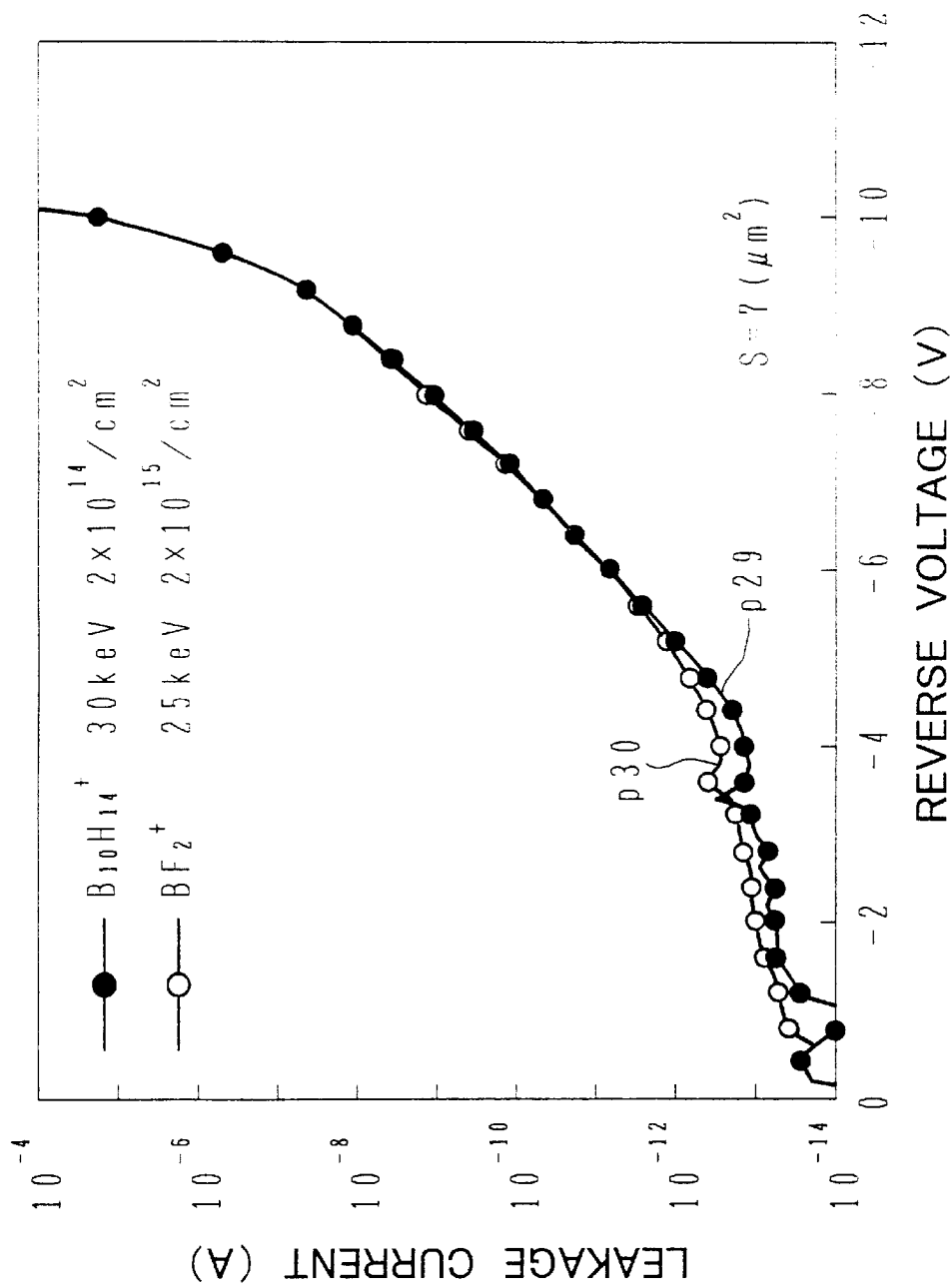
FIG. 10 is a graph showing the relationship between the leakage current and the reverse voltage.

FIG. 10 is a graph showing the reverse bias characteristics of a p$^+$n junction. The abscissa represents the reverse bias voltage in V and, and the ordinate represents the leak current in A. Curve p29 represents the case of ion implanting B$_{10}$H$_{14}$ ions at an acceleration energy of 30 keV at a dose of $2\times10^{14}$ cm$^{-2}$, and curve p30 represents the case of ion implanting BF$_2$ ions at an acceleration energy of 25 keV at a dose of $2\times10^{15}$ cm$^{-2}$. It can be seen that good reverse bias characteristics can be obtained in the case of forming a p$^+$n junction by ion implanting decaborane, similar to the case of forming a p$^+$n junction by ion implanting BF$_2$ ions.

Figure 11:
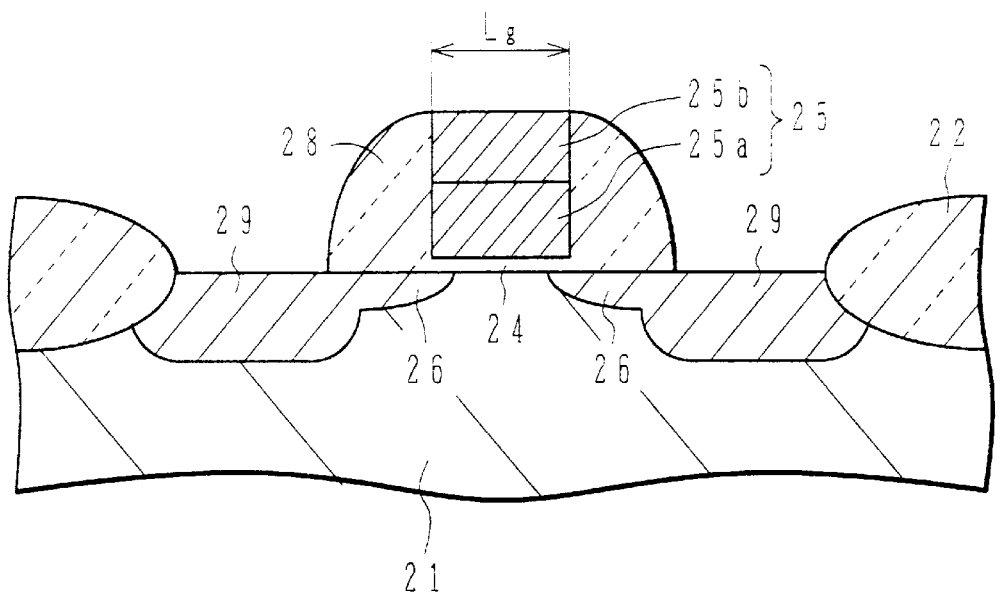
FIG. 11 is a schematic cross section of a semiconductor device to be formed by utilizing decaborane ion implantation.

FIG. 11 schematically shows a p-channel MOS transistor structure. On a surface of an n-type silicon region 21, a field oxide film 22 is selectively formed. In an active region defined in the field oxide film 22, a gate oxide film 24 of a thickness of about 4 nm is formed, and a polycrystalline or amorphous silicon gate electrode 25 is formed thereon. When the gate electrode 25 is formed by a polycide structure, a polycrystalline silicon gate electrode 25a and a silicide layer 25b are laminated from the lower side in this order. The silicon gate electrode can have a thickness of less than 0.1 micrometer. After the gate electrode 25 is patterned, decaborane ions are implanted at an acceleration energy of 5 keV at a dose of $1\times10^{13}$ cm$^{-2}$, to form extensions 26 of lightly doped drain (LDD) structure. As a reference, those samples are also formed wherein BF$_2$ ions are implanted at an acceleration energy of 5 keV at a dose of $1\times10^{14}$ cm$^{-2}$ to form extensions 26.

Thereafter, insulating layer such as SiO$_2$ is deposited by chemical vapor deposition (CVD), and is subjected to anisotropic etching, to form sidewall spacers 28. After the formation of sidewall spacers 28, decaborane ions are implanted at an acceleration energy of 30 keV at a dose of $2\times10^{14}$ cm$^{-2}$ to achieve doping of source/drain regions 29 and the gate electrode 25. Before ion implantation of decaborane ions of an inert element can be implanted to form a surface amorphous layer. Thereafter, activation annealing is done at 1000° C. for 10 seconds by rapid thermal annealing (RTA). Here, the gate length is denoted by Lg as shown in the figure. The source/drain regions are relatively deep, and hence may be formed through ion-implantation of BF$_2$.

Figure 12A:
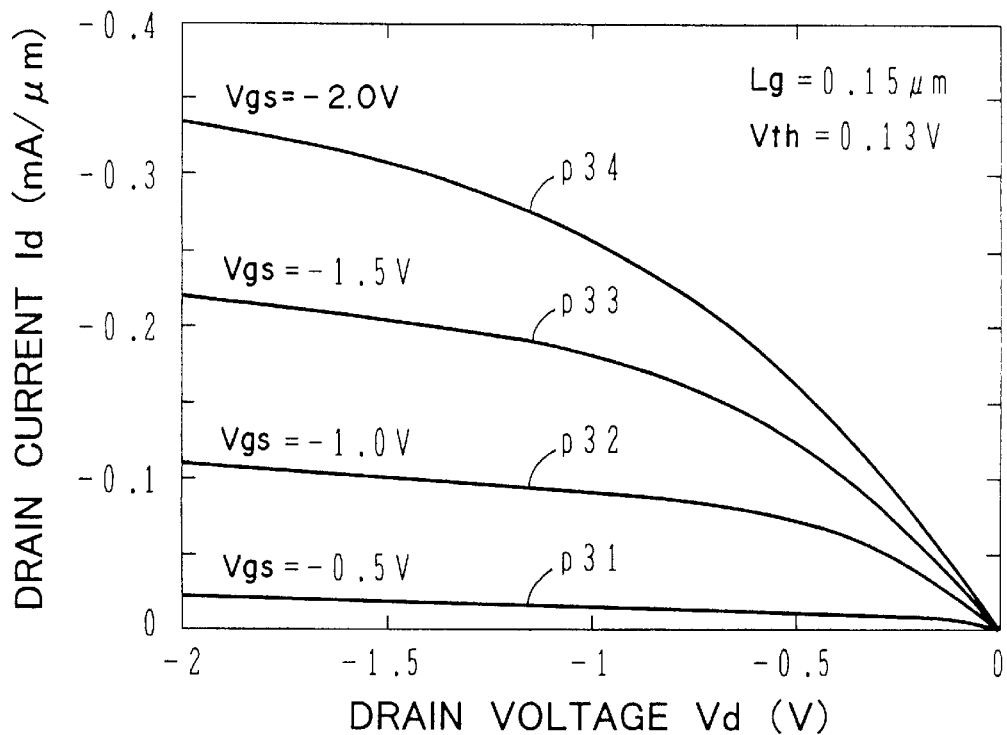
FIGS. 12A and 12B are graphs showing the relationships between the drain current and the drain voltage, and between the drain current and the gate voltage.
Figure 12B:
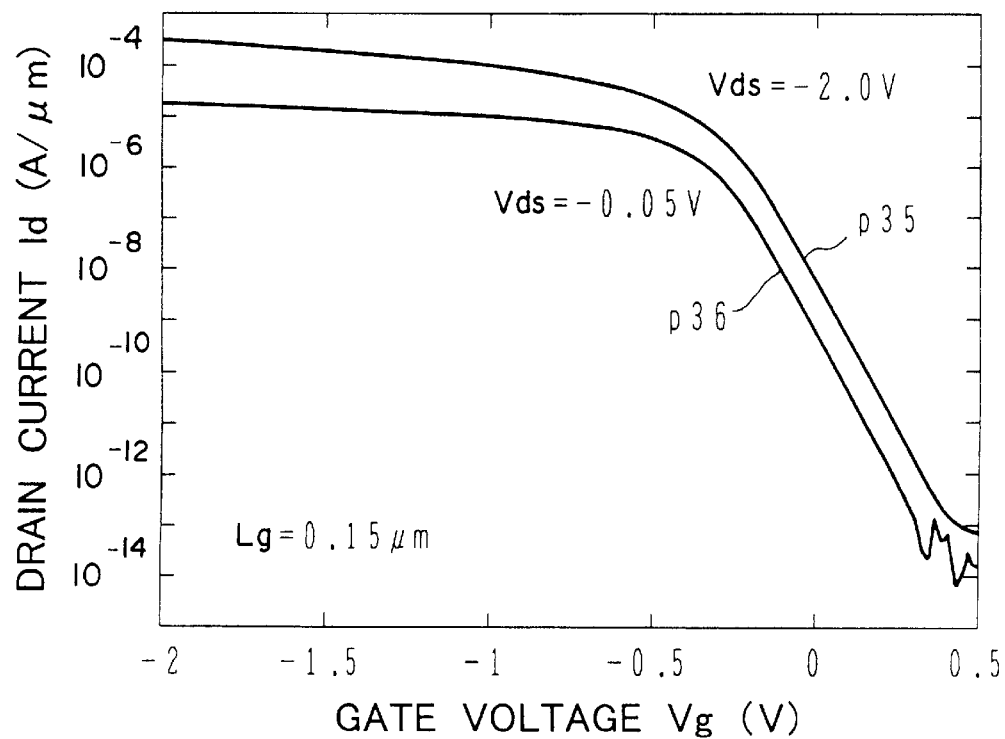

FIGS. 12A and 12B show drain current Id vs drain voltage Vd characteristics, and drain current Id vs gate voltage Vg characteristics of a p-channel MOS transistor implanted with decaborane in LDD regions, respectively.

Good transistor characteristics of threshold voltage Vth=−0.13 V, drain current Id=−0.33 mA/$\mu$m, S factor=85 mV/dec at the power source voltage of 2V are obtained.

Figure 13:
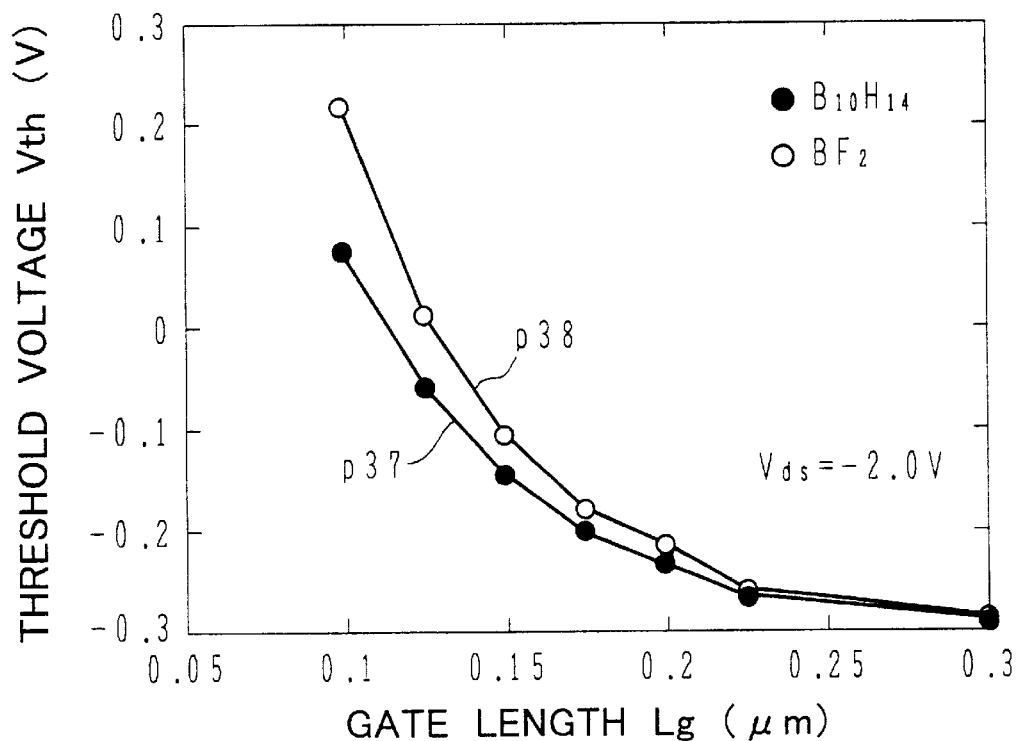
FIG. 13 is a graph showing the relationship between the threshold voltage and the gate length.

FIG. 13 is a graph showing the dependency of threshold voltage Vth of a p-channel MOS transistor implanted with decaborane and BF$_2$ in LDD regions on the gate length Lg. The abscissa represents the gate length Lg in $\mu$m, and the ordinate represents the threshold voltage Vth in V. Curve p37 shows the case of implanting decaborane, and curve p38 shows the case of implanting BF$_2$. As the gate length Lg becomes short, curves p37 and p38 both show increase. The degree of increase is larger in curve p38. That is to say, it is seen that the short channel effect can be suppressed by implanting decaborane in LDD regions. As is described before, ion implantations of B$_{10}$H$_{14}$ and BF$_2$ are both performed at an acceleration energy of 5 keV. In this case, it is considered that a shallower junction can be formed in the case of implanting decaborane.

Figure 14:
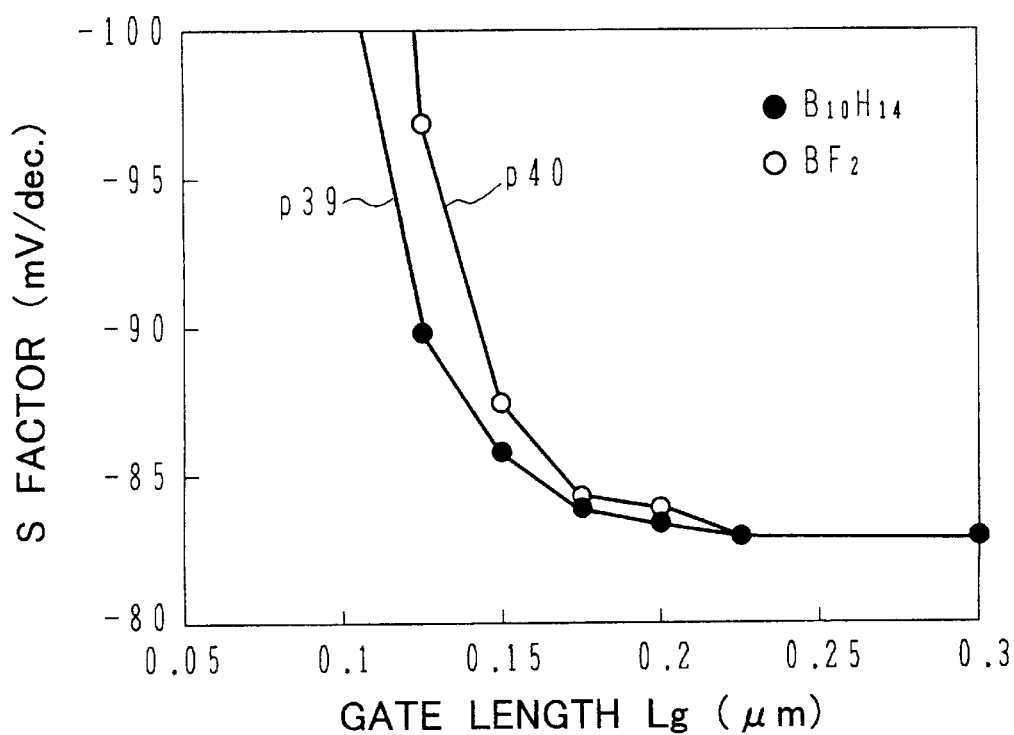
FIG. 14 is a graph showing the relationship between the S factor and the gate length.

FIG. 14 shows the dependency of S factor on the gate length Lg. The abscissa represents the gate length Lg in $\mu$m, and the ordinate represents S factor in mV/dec. Curve p39 shows the case of implanting decaborane, and curve p40 represents the case of implanting BF$_2$. As the gate length Lg becomes short, both the curves p39 and p40 rise. The degree of rising is smaller in curve p39. That is to say, it is seen that short channel effect can be suppressed by implanting decaborane with respect to S factor.

Figure 15:
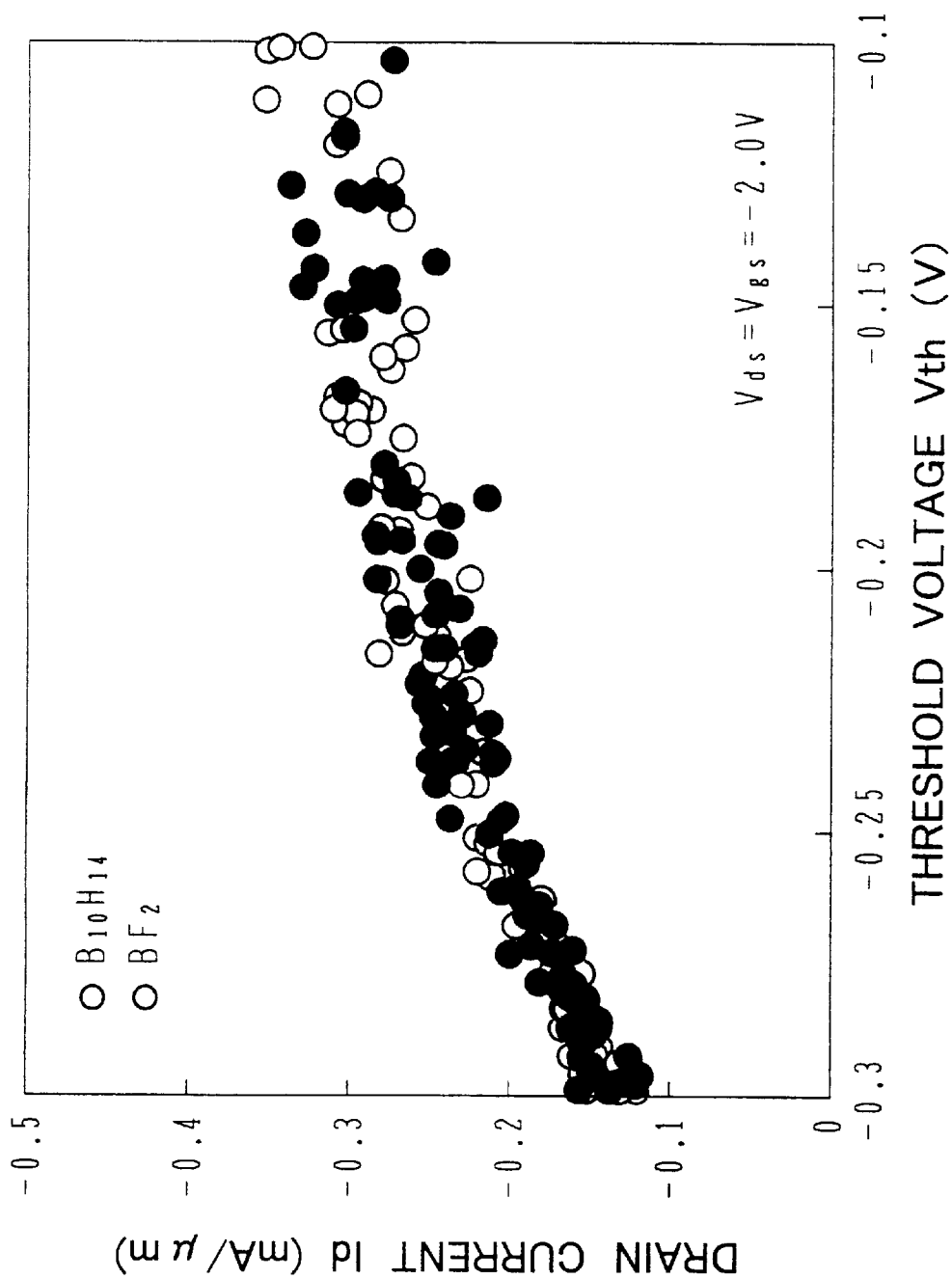
FIG. 15 is a graph showing the relationship between the drain current and the threshold voltage.

FIG. 15 shows the dependency of drain current Id on the threshold voltage Vth. The abscissa represents the threshold voltage Vth in V, and the ordinate represents the drain current Id in mA/$\mu$m. Taking the threshold voltage Vth as a parameter, it is seen that almost the same current is allowed to flow in both the cases of implanting decaborane and BF$_2$.

Combining the above experimental results, it is seen that p-channel MOS transistors of good characteristics with less short channel effect can be provided when decaborane ions are implanted to form shallow p-type region.

In a p-channel MOS transistor, the height of the polycrystalline silicon gate electrode is usually determined by the implantation depth of boron. The height of the polycrystalline silicon gate electrode is selected to be sufficiently high so that the gate oxide film is prevented from being implanted with boron. If the polycrystalline silicon gate electrode causes depletion at the side of the gate oxide film, good transistor characteristics cannot be expected. Therefore, it is necessary to dope a polycrystalline silicon gate with sufficiently high concentration of impurity. At the current ion implantation technology, it is difficult to ion implant boron atoms heavily and sufficiently shallowly.

Figure 16:
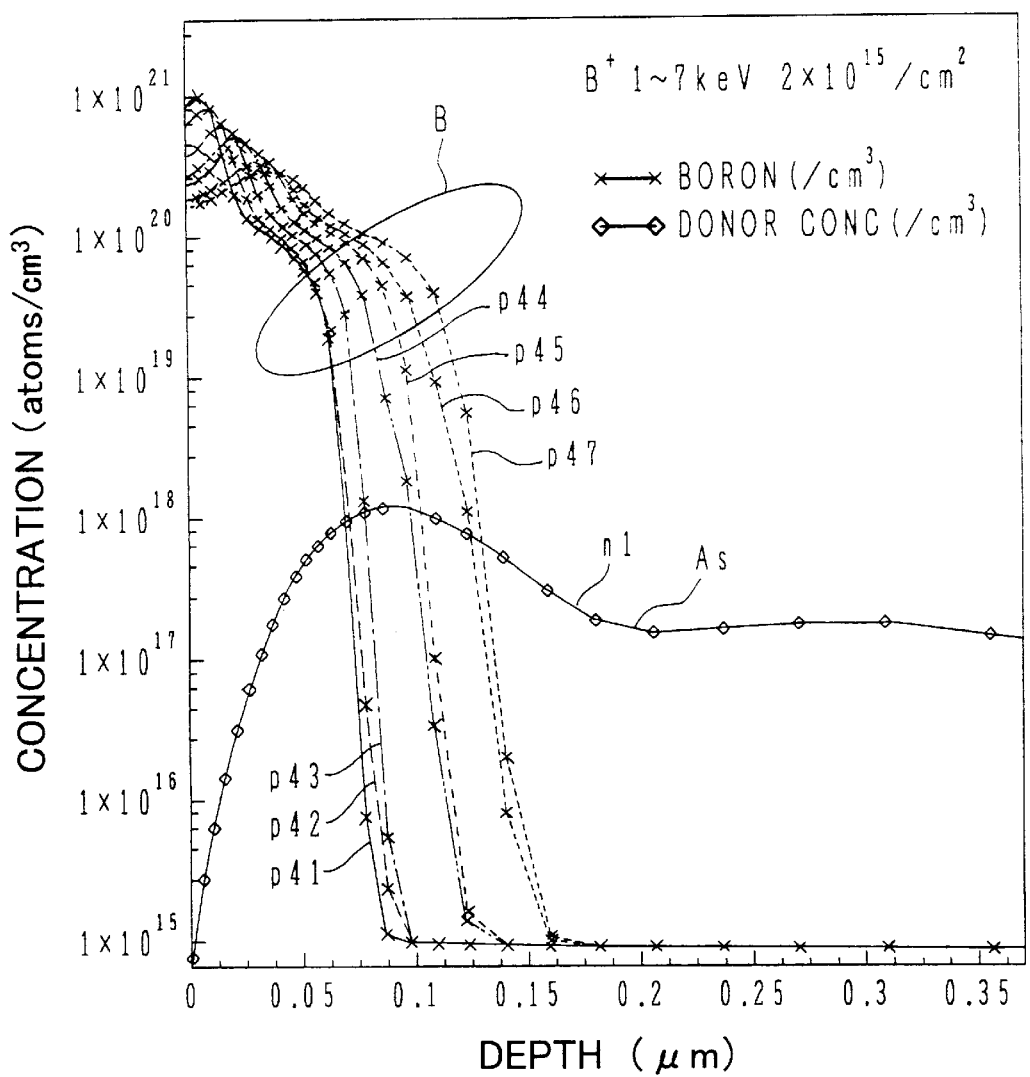
FIG. 16 is a graph showing the result of simulation for boron distribution at various implantation energies.

FIG. 16 is a graph showing the calculation results for the boron concentration profile when boron ions are implanted into silicon substrate. The abscissa represents the depth in the substrate in micrometer and ordinate represents the boron concentration in atoms/cm3. The acceleration energy of boron ions is varied in the range of 1 keV–7 keV, and the dose is set at $2\times10^{15}$ cm$^{-2}$. Curves p41–p47 respectively represent the boron concentration profiles when the acceleration energy in boron ion implantation is 1 keV–7 keV. Curve n1 shows the distribution of As atoms which is ion implanted as the background. The low acceleration energy ion implantation of boron which is currently available employs an acceleration energy of about 7 keV. In this case, the implantation depth is about 160 nm. Considering the process margin, the gate height is set usually at 180 nm. When the gate height is desired to be reduced to for example, 120 nm or less, the implantation depth of boron ions is desired to be about 100 nm or less, considering the process margin. In this case, the acceleration energy of boron ions should be 3 keV or less. Using the ion implantation system currently available, when boron ions are to be implanted at an acceleration energy of 3 keV or less, it will require a tremendously long time due to exponential decrease of the beam current.

As is described above, by using decaborane, the effective acceleration energy per each boron atom can be reduce to about $1/10$, and the boron atom concentration with respect to ion current can be increased to about 10 times. Therefore, employing the ion implantation of decaborane, it becomes easy to realize a gate electrode of lower height. When the height of a gate electrode is made low, the polycide gate etching in the case of polycide gate electrode becomes easy, and the formation of a contact hole becomes easy.

In a buried channel type MOS transistor, formation of an extremely shallow pn-junction under the gate becomes a key technology. In the manufacture of a buried p-channel MOS transistor, decaborane ion implantation can be employed for forming a buried channel. When a shallow pn-junction is formed by ion implanting decaborane, an excellent buried p-channel MOS transistor can be realized, which is strongly resistant to the short channel effect.

In the ion implantation system shown in FIG. 3, electron irradiation is employed for ionizing decaborane. When the energy of the irradiating electrons is set high, the ionization efficiency for decaborane can be increased, and a high beam current can be taken. However, when the energy of the irradiating electrons is set high, decaborane molecules can be easily decomposed. For example, $B^+$ ions, $B_2H_4^+$ ions, etc. can be produced. When ion implantation is achieved in this state, boron-containing ions of smaller mass number can be implanted deeper, so as to deepen the effective implantation depth.

Single kind of boron isotope, i.e. mass number of 10 or 11, can be used to synthesize decaborane to reduce the spread of mass number.

Figure 17A:
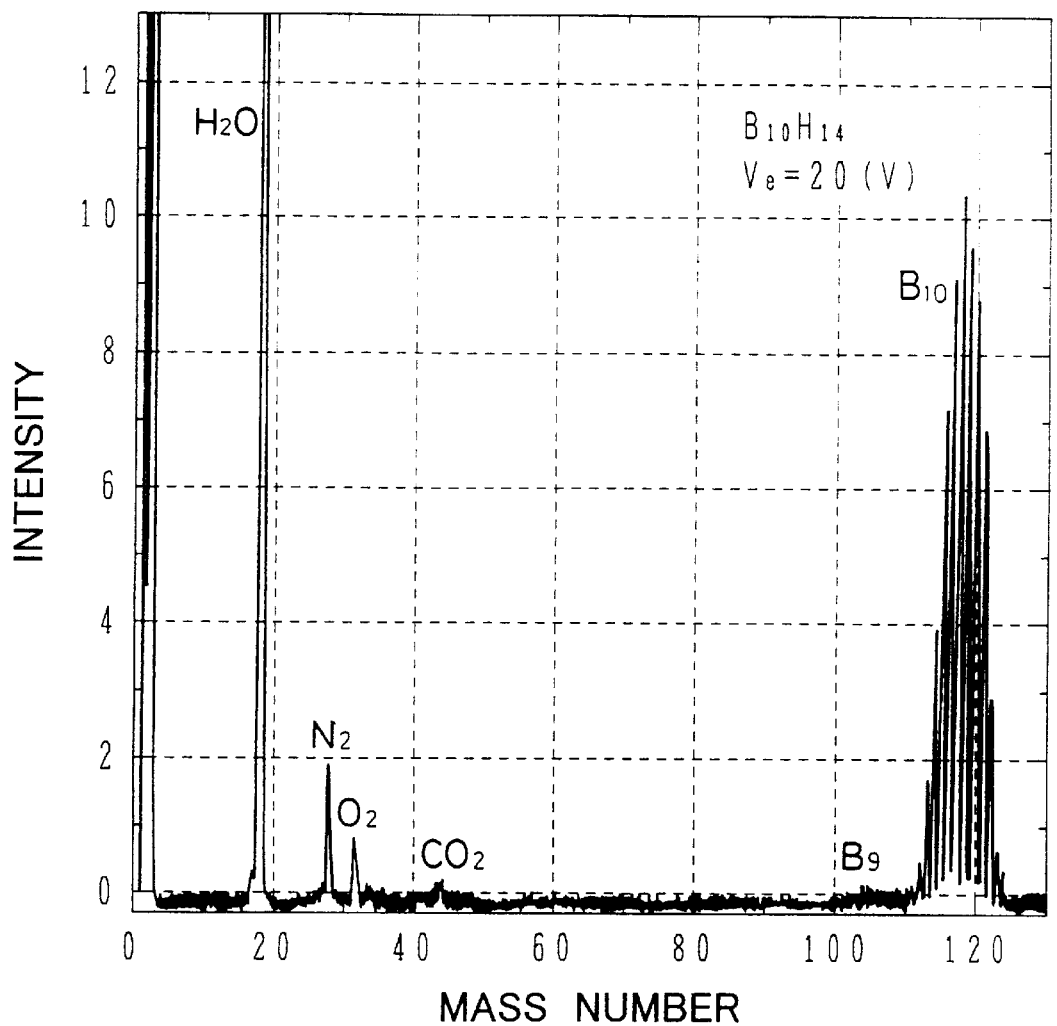
FIGS. 17A, 17B, 17C and 17D are graphs showing the experimental results of mass spectroscopy when decaborane molecules are irradiated with electrons of various acceleration voltage.
Figure 17B:
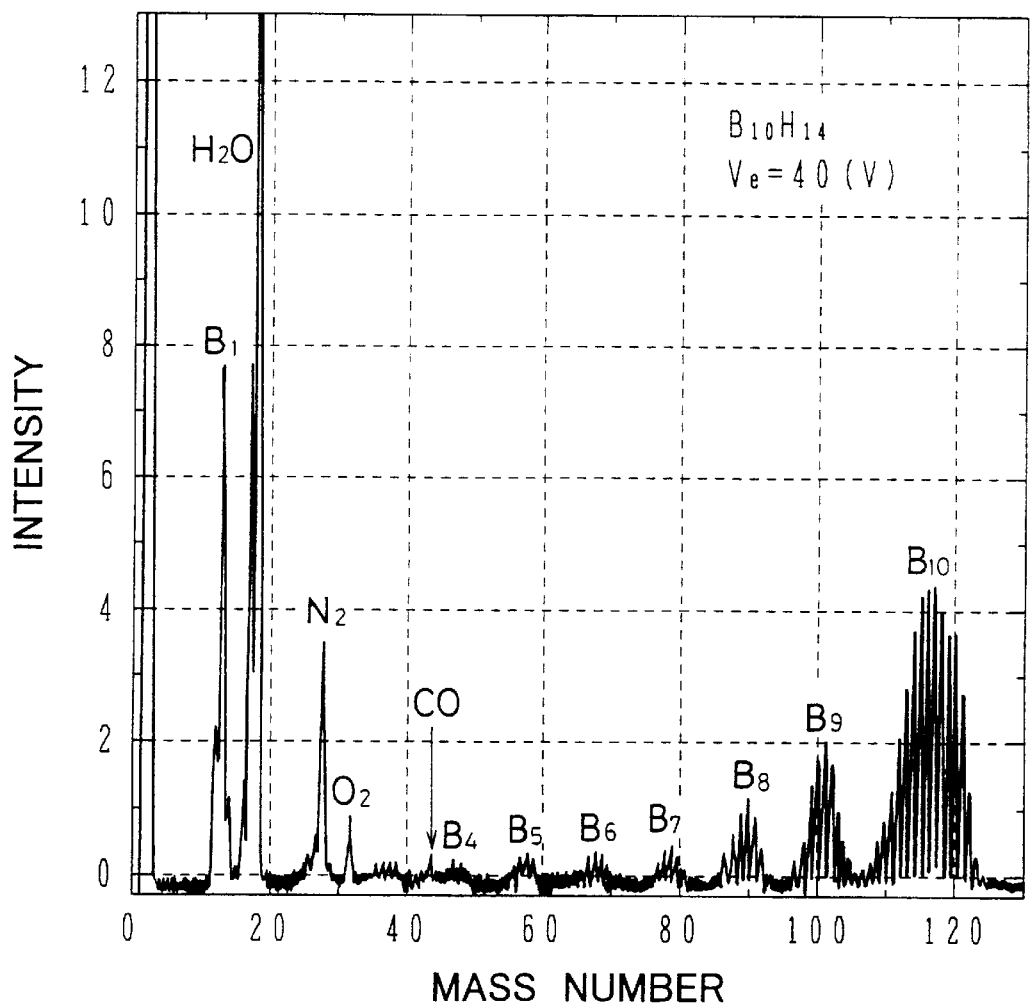
Figure 17C:
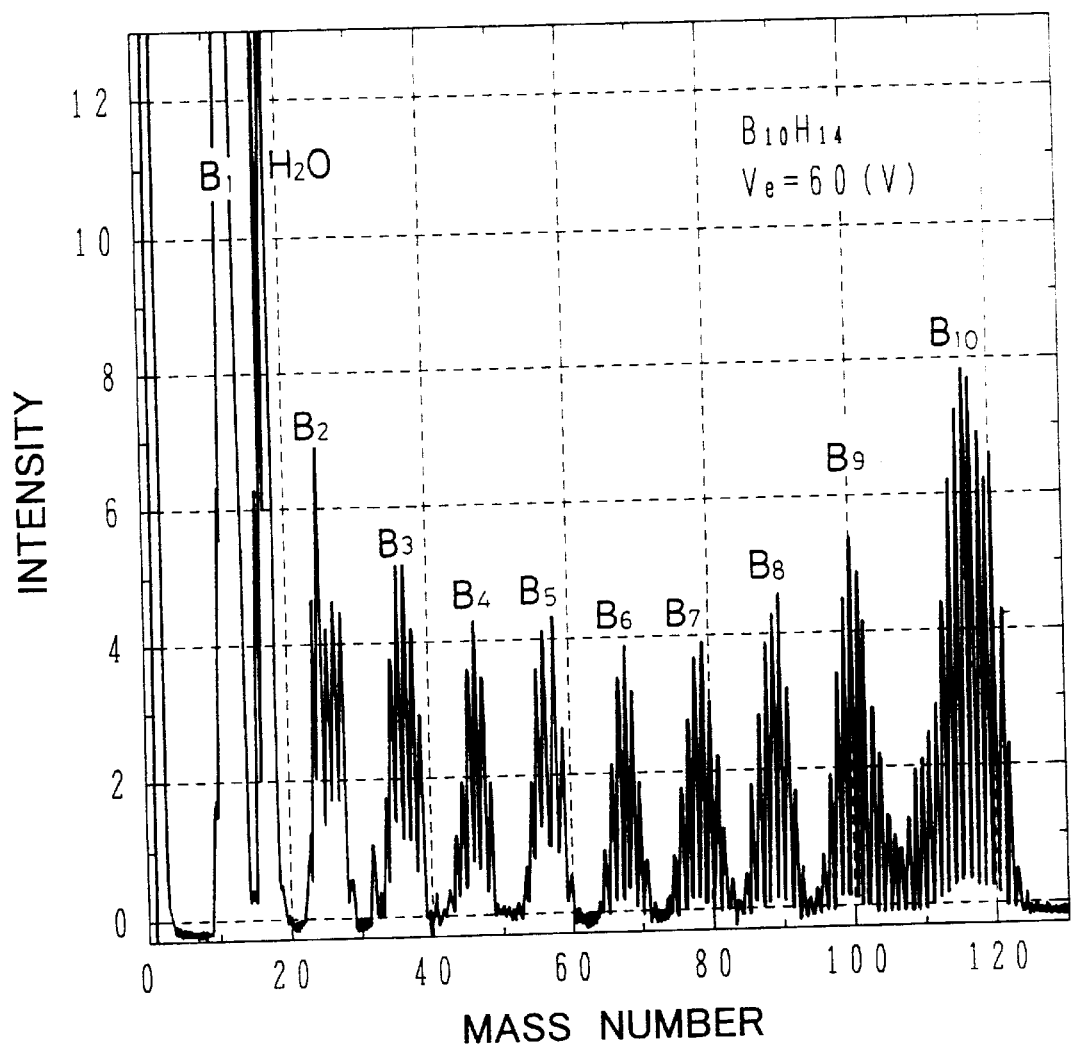
Figure 17D:
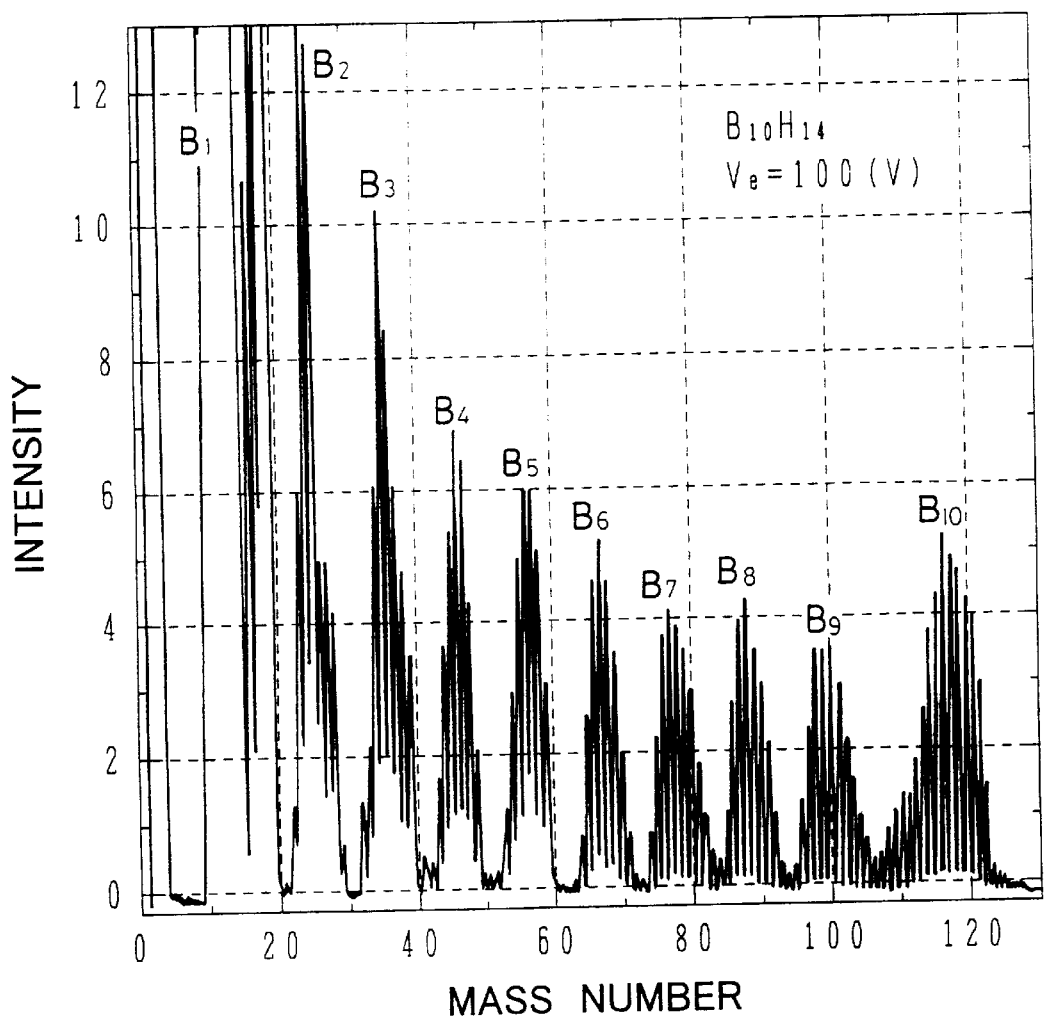

FIGS. 17A to 17D are graphs showing the results of mass analysis of particles generated when electrons of an acceleration energy of 20V to 100V are irradiated to decaborane molecules. The abscissa represents the mass number and the ordinate represents the strength of signal. FIG. 17A shows the case of an acceleration voltage Ve=20V, FIG. 17B represents the case of an acceleration voltage Ve 40V, FIG. 17C represents the case of an acceleration voltage Ve 60V, and FIG. 17D represents the case of an acceleration voltage Ve=100V.

In the case when the acceleration voltage Ve for electrons is 20V, respective decaborane-related species containing nine or less B atoms are very few, and ions containing ten B atoms occupy almost the whole part. Hereinbelow, species containing 10 B atoms will be called decaborane, for convenience.

As shown in FIGS. 17B to 17D, when the acceleration voltage Ve for electrons is increased to 40 V or higher, the probability density of decaborane decreases rapidly, and speices containing nine or less B atoms increase. In the case of an acceleration voltage Ve=100V, the intensity of the species containing only one B atom is strongest, the intensity decreases as the number of B atoms increases, the intensity of the species containing nine B atoms is the lowest, and the peak height of decaborane becomes higher than the peak of the species containing nine B atoms.

When the acceleration voltage Ve is set at 40V or higher, if all the species generated ionizing decaborane are ion implanted, decaborane-related speices of various mass number will be ion-implanted. If mass analysis after ionization is not employed, the acceleration voltage for the irradiating electrons is preferablely set below 40V.

Preferred mass range when mass analysis is employed after ionizing decaborane by plasma or high energy electron irradiation, will be described below.

Isotopes of boron contain boron of mass number 10 and boron of mass number 11 at a probability ratio of about 2:8. As decaborane molecule contains 10 B atoms, the molecular mass number of decaborane can change from 114 to 124 depending on the mixture ratio of isotopes.

In ion implantation, ion species to be implanted can be selected if generated ions are subjected to mass analysis. In the case of implanting B ions and As ions, mass numbers 11 and 54 can be selected. In the case of decaborane, however, the molecular mass number changes in a wide range as described above. Considering all the combinations of isotopes, mass analysis will select molecular mass number of 114 to 124. Further, hydrogen atoms constituting decaborane molecule can be released from the molecule by electron irradiation.

FIG. 18 shows the result of mass analysis of decaborane when the acceleration voltage Ve of irradiating electrons is set at 20V, 40V, and 60V, in the range of mass number 107 to 124. The abscissa represents the mass number, and the ordinate represents the strength of signal. Distributions having a peak commonly at around mass number 117 are formed in either of the acceleration voltages. In the case of acceleration voltage Ve=20V, the distribution extends in the mass number range of 111 to 124. When the acceleration voltage is increased to 40V or more, the distribution in higher mass number range does not change much, and the distribution in the lower mass number range spreads wider. When the acceleration voltage is set at 40V or more, many ions of the species containing nine or less B atoms are generated. Therefore, mass analysis is needed. In this case, it is preferable to set the mass number range from 107 to 123. By thus setting the mass number range, almost the whole ions of the species containing ten B atoms can be utilized, excluding the species containing nine or less B atoms.

Figure 19:
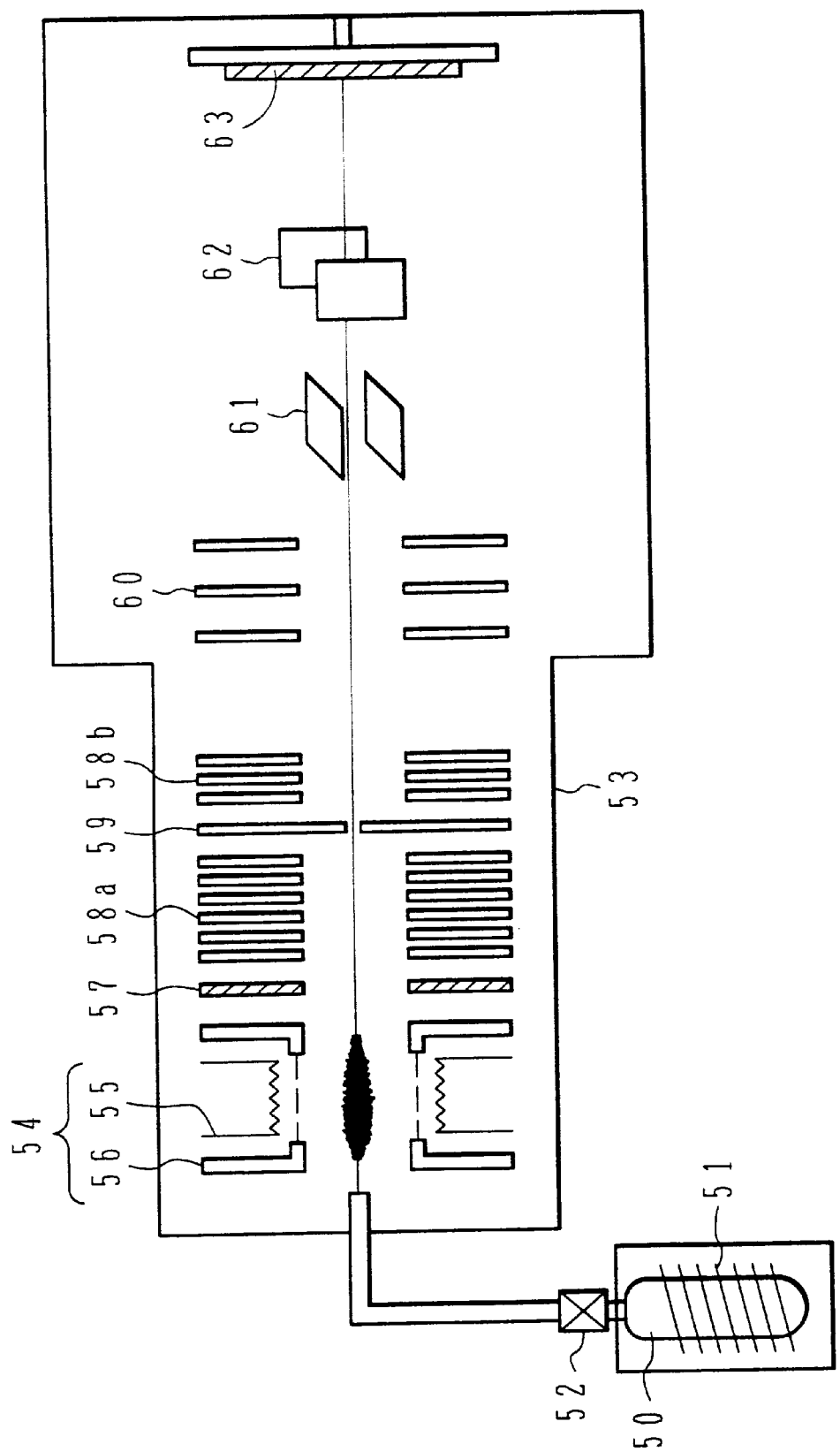
FIGS. 19, 20 and 21 are schematic cross sectional diagrams showing ion implantation systems for implanting decaborane.
Figure 20:
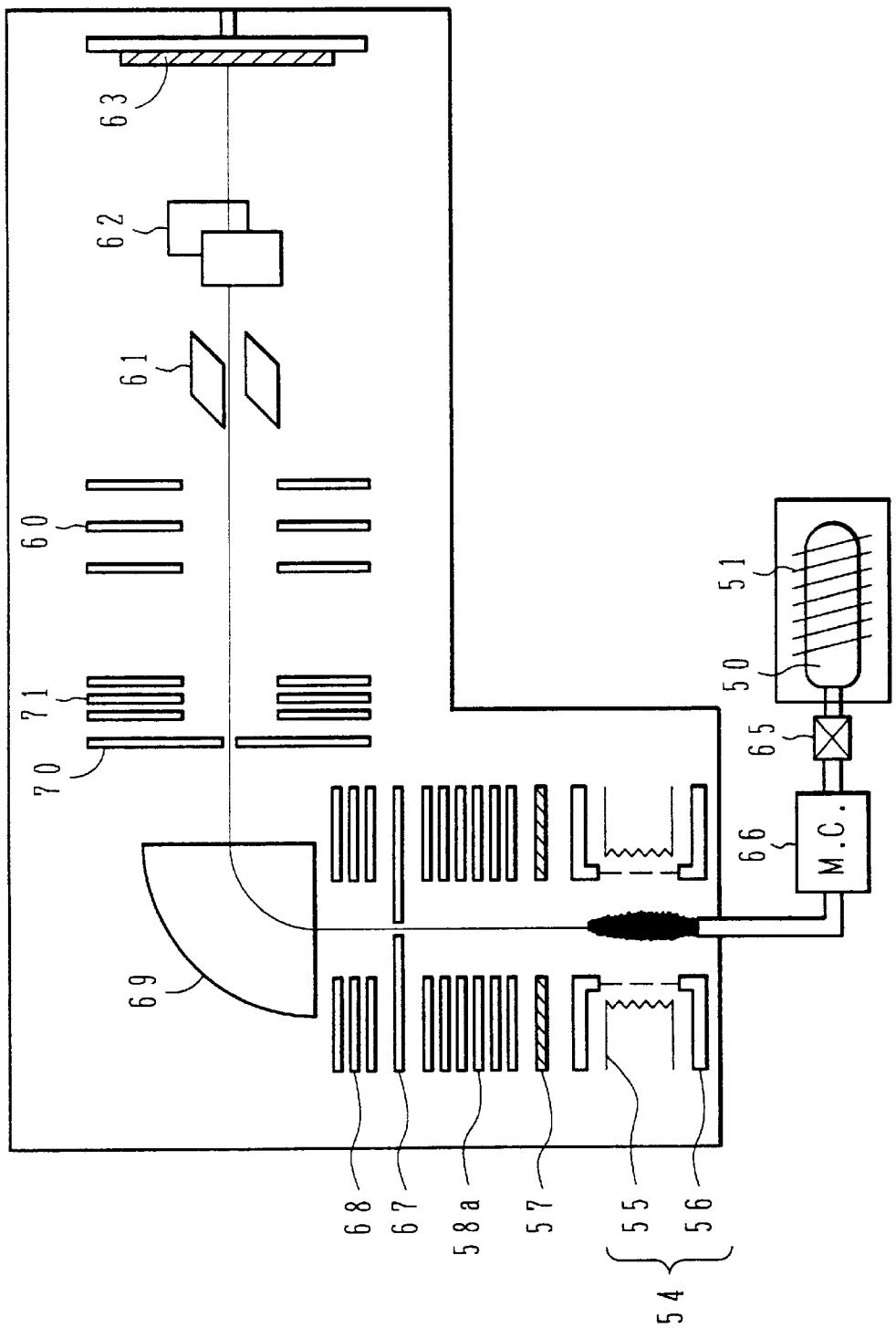
Figure 21:
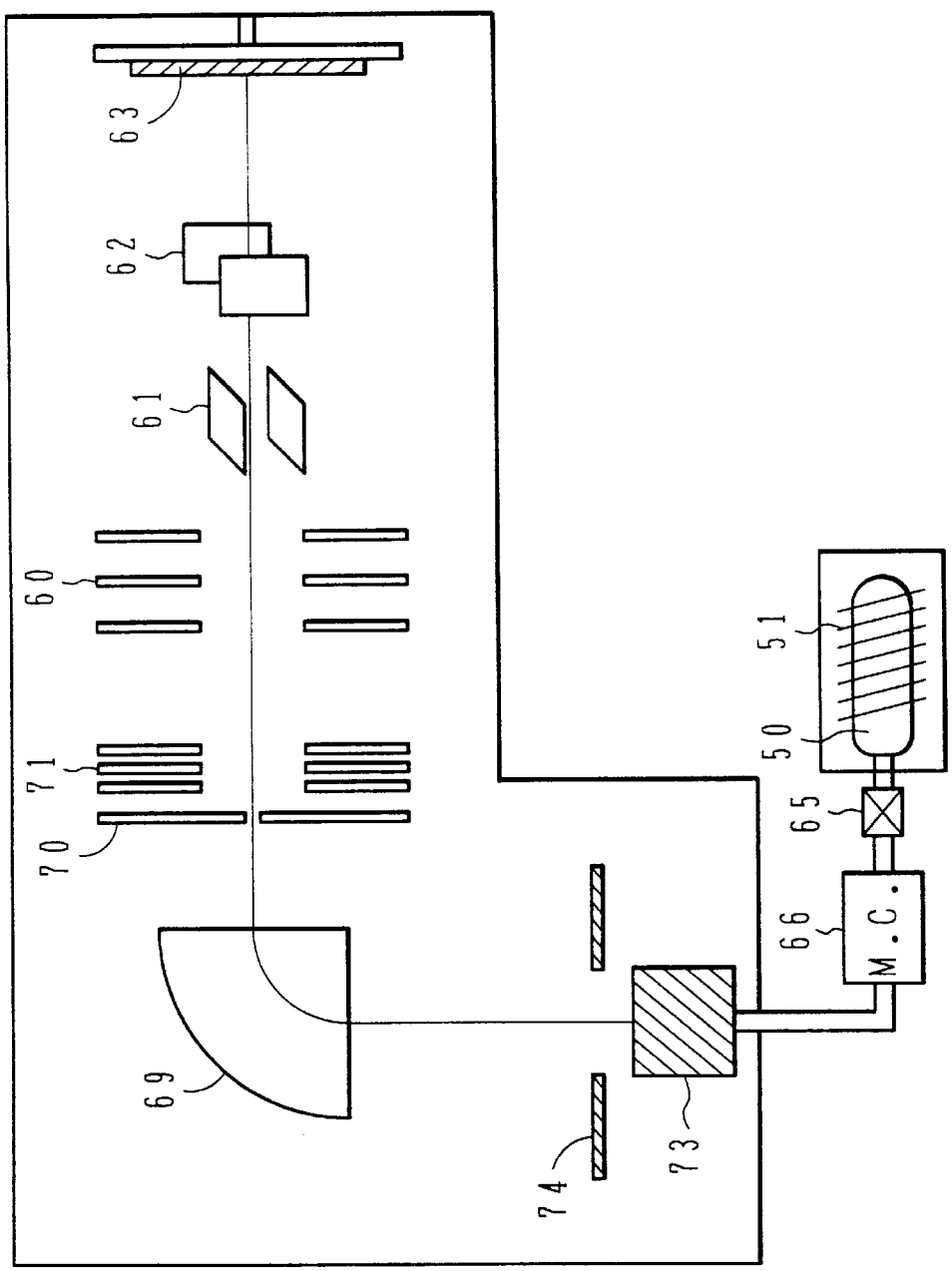

FIGS. 19 to 21 show examples of the structure of the ion implantation system adapted for implanting decaborane ions.

In FIG. 19, a decaborane bottle 50 containing decaborane is provided with a heater 51 for heating the inside of the decaborane bottle 50 to a desired temperature, and is connected through a needle valve 52 to a vacuum chamber 53. In the vacuum chamber 53, an electron irradiation system 54 including a filament 55 and an anode 56 is disposed near the position at which decaborane gas is ejected. An extraction electrode 57 is placed next to the electron irradiation system 54 to extract positive ions. The ions extracted by the extraction electrode 57 are focused through lenses 58a, 58b, and an aperture 59. The focused ion beam is accelerated by the accelerator 60, and deflected by X deflector 61 and Y deflector 62 to be implanted to a desired position on the target 63.

In the system of FIG. 19, decaborane molecules are ionized by electron irradiation.

In the system of FIG. 20, a combination of a stop valve 65, and a mass flow controller 66 is used in place of the needle valve 52 of FIG. 19. The stop valve 65 assures that the background pressure of the mass flow controller 66 is about 1 torr or above. After the first stage electron lens 58a, an input aperture 67, an electron lens 68, an analyzer magnet 69, and an output or resolving aperture 70 are disposed to constitute a mass analyzer. After the output aperture 70, another electron lens 71 is disposed.

Other structures of the system of FIG. 20 are similar to those of FIG. 19.

In the system of FIG. 20, since the flow of decaborane can be regulated by the stop valve 65 and the mass flow controller 66, the decaborane bottle 50 can be heated above 50° C., to stabilize the supply of decaborane molecules.

In the system of FIG. 21, a plasma ion source 73 is used in place of electron irradiating system. An extraction electrode 74 is placed after the plasma ion source to supply an ion beam to the analyzer magnet 69. Other components of the system of FIG. 21 are similar to those of FIG. 20.

As described above, decaborane ions can be utilized to form a very shallow doped region. Further, we have found that ion acceleration energy below a certain level is preferable to maintain the impurity distribution after activation annealing very shallow.

FIG. 22 shows boron distribution profile when decaborane ions are accelerated at 5 keV and 10 keV. In the figure, the abscissa represents the depth in the substrate in nm, and the ordinate represents B concentration in atoms/cm$^3$, measured by secondary ion mass spectroscopy (SIMS). Curves p50 represents as-implanted boron distribution when decaborane ions are accelerated at 5 keV at a dose of $1\times10^{13}$ cm$^{-2}$. Curve p51 represents the boron distribution after an activation annealing at 900° C. for 10 seconds is done after ion implantation of curve p50. It is clearly seen that the boron distribution p51 is very close to the distribution of curve p50.

Curve p52 represents the as-implanted boron distribution after implanting decaborane accelerated at 10 keV at a dose of $10\times10^{13}$ cm$^{-2}$. Curve p53 represents boron distribution after activation annealing at 900° C. for 10 seconds is achieved after decaborane implantation of curve p52. By the activation annealing, the distribution p53 extends considerablely deeper than the as-implanted distribution p52. It is necessary to activate the implanted ions for obtaining electrically active impurity atoms. Therefore, to obtain very shallow junction depth, it is preferable to implant decaborane at an acceleration energy of about 5 keV or below.

In the case of implanting boron ions, a transient enhanced diffusion was always observed, in which boron distribution below $10^{18}$ cm$^{-3}$ expands (diffuses) excessively. This was also observed when decaborane was implanted at an acceleration energy of 10 keV. At the acceleration energy of 5 keV, the transient enhanced diffusion was suppressed significantly, enabling very shallow junction. At the acceleration energy of 5 keV, the averaged acceleration energy per single boron ion is 500 eV, which could not be realized in the conventional boron ion implantation.

Impurity atoms may penetrate Si crystal by channeling. For preventing channeling, it is preferable to form an amorphous layer at the surface of the substrate. For example, Ge ions may be implanted at an acceleration energy of 40 keV at a dose of $2\times10^{14}$ atoms/cm$^2$, and then decaborane ions may be implanted into the Si crystal.

As has been described above, use of decaborane as a source of boron atoms makes it possible to implant boron atoms shallowly at a high efficiency, compared to ion implantation of boron ions.

The present invention has been described along the preferred embodiments. The present invention is not limited thereto. For example, it will be apparent for those skilled in the art that various modifications, alterations, improvements, and combinations thereof are possible.

What we claim is:

1. A method of implanting ions comprising the steps of:
   vaporizing solid decaborane ($B_{10}H_{14}$) to generate vaporized decaborane molecules;
   ionizing the vaporized decaborane molecules to generate decaborane ions; and
   accelerating the decaborane ions by electric field to implant into a target thereby decomposing decaborane ions into boron atoms.

2. A method according to claim 1, wherein said step of vaporizing solid decaborane includes the step of vaporizing solid decaborane in a reduced pressure atmosphere.

3. A method according to claim 1, wherein said step of vaporizing solid decaborane includes the step of heating solid decaborane.

4. A method according to claim 1, further comprising the step of supplying vaporized decaborane through a stop valve and an adjust valve into an ionization chamber in which said step of ionizing decaborane molecules is performed.

5. A method according to claim 1, wherein said step of ionizing decaborane molecules includes the step of irradiating electrons to the decaborane molecules.

6. A method according to claim 5, wherein said step of irradiating electrons includes the step of irradiating electrons of an acceleration energy of 20 eV or less.

7. A method according to claim 1, further comprising the steps of, after said step of ionizing decaborane molecules, mass analyzing ionized particles and selecting ions of desired species.

8. A method according to claim 5, further comprising the steps of, after said step of ionizing decaborane molecules, mass analyzing ionized particles and selecting ions of desired species.

9. A method according to claim 7, wherein said step of mass analyzing ionized particles includes the step of selecting mass numbers in a range of 107 to 123.

10. A method according to claim 1, wherein said step of ionizing decaborane molecules includes the step of ionizing decaborane molecules by plasma.

11. A method according to claim 10, further comprising the step of, after said step of ionizing decaborane molecules, mass analyzing ionized particles and selecting ions of desired species.

12. A method according to claim 1, wherein boron atoms in said decaborane molecules are constituted only of boron atoms of mass number 11.

13. A method according to claim 1, wherein boron atoms in said decaborane molecules are constituted only of boron atoms of mass number 10.

14. A method according to claim 1, wherein said step of accelerating decaborane ions accelerates decaborane ions at an acceleration energy of about 5 keV or below.

15. A method according to claim 1, further comprising implanting electrically inert impurity atoms into the target to form an amorphous surface layer, before said step of accelerating decaborane ions.

16. A method according to claim 1, wherein the target is a silicon substrate.

* * * * *